(12) United States Patent
Kubo et al.

(10) Patent No.: US 6,642,093 B2
(45) Date of Patent: Nov. 4, 2003

(54) METHOD FOR MANUFACTURING A SEMICONDUCTOR DEVICE

(75) Inventors: Shunji Kubo, Tokyo (JP); Atsushi Amoo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 25 days.

(21) Appl. No.: 10/252,519

(22) Filed: Sep. 24, 2002

(65) Prior Publication Data

US 2003/0186491 A1 Oct. 2, 2003

(30) Foreign Application Priority Data

Mar. 28, 2002 (JP) ......................... 2002-090483

(51) Int. Cl.⁷ .................. H01L 21/336; H01L 21/8234
(52) U.S. Cl. ........................ 438/197; 438/289
(58) Field of Search ........................... 438/197, 204, 438/257, 258, 275, 289, 301

(56) References Cited

U.S. PATENT DOCUMENTS 6,121,649 A * 9/2000 Kunishima

FOREIGN PATENT DOCUMENTS

| JP | 11-135740 | 5/1999 |
| JP | 2000-196017 | 7/2000 |
| JP | 2000-332210 | 11/2000 |
| JP | 2001-127270 | 5/2001 |

* cited by examiner

Primary Examiner—Phuc T. Dang
(74) Attorney, Agent, or Firm—Burns, Doane, Swecker & Mathis, LLP

(57) ABSTRACT

According to the present invention, a method for manufacturing a semiconductor device forms a cobalt silicide film 11 on source/drain regions 7a and 7b and a gate electrode 4 of transistors in the logic circuit region, making it possible to form a high-performance and highly integrated logic circuit.

4 Claims, 38 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly to a method for manufacturing an embedded DRAM, in which a DRAM (Dynamic Random Access Memory) made up of cells having a CUB (Capacitor Under Bit Line) structure and a logic circuit made up of dual gate salicide CMOS transistors are formed on a same silicon substrate.

2. Background Art

In recent years, semiconductor devices must satisfy various demands: they must be miniaturized and highly integrated having small size and lightweight. Such demands have led to the need for developing a semiconductor device in which various devices are formed on a single chip. In such a representative semiconductor device, a memory device, such as a DRAM, and a logic device are formed on a same semiconductor substrate as a single chip.

Description will be made below of a method for manufacturing a conventional embedded DRAM with reference to FIGS. 44 to 54. In FIGS. 44 to 54, the left hand side shows the memory cell region, while the right hand side shows the logic circuit region.

First of all, a trench separation oxide film 102 is formed on a semiconductor substrate 101 as shown in FIG. 44. Then, N-type impurity ions such as phosphorus (P) are implanted in the memory cell region to form the bottom N-well layer (the bottom surface separation layer). After that, the logic circuit region is covered with a photoresist (not shown), and P-type impurities such as boron (B) are implanted in the memory region to form a P-well region. P-type impurities such as boron (B) are also implanted in the logic circuit region, forming a P-well region. Furthermore, an N-well.region (now shown) for forming PMOSs is formed in the logic circuit region.

Then, a gate oxide film 103 is formed by, for example, a thermal oxidation method. After that, a gate electrode (layer) made up of a polycrystalline silicon (layer) 104 and a tungsten silicide (layer) 105 is laminated (on the gate oxide film 103). Furthermore, a silicon oxide film 106 of TEOS (Tetra Ethyl Ortho Silicate Glass), etc. and a silicon nitride film 107 are laminated on the gate electrode (layer). The silicon oxide film 106 and the silicon nitride film 107 are used as etching masks for forming gate electrodes and as etching stoppers for forming self alignment contacts disposed between the gate electrodes. After that, impurities are implanted in the semiconductor substrate 101, forming the source/drain regions 108a and 109a of the transistors.

Then, as shown in FIG. 45, a silicon nitride film is formed, and anisotropic etching is carried out, forming sidewall spacer silicon nitride films 110 on the gate electrode sidewalls. Then, in the logic circuit region, impurities are implanted over the sidewall spacer silicon nitride films 110 to form the source/drain regions 109b, thereby forming a LDD (Lightly Doped Drain) structure.

Then, as shown in FIG. 46, an interlayer insulation film 111 of BPTEOS (Boro Phospho Tetra Ethyl Ortho Silicate Glass), etc. is laminated on a thin silicon nitride film (not shown) disposed on the surface. Contact holes are then formed between the gate electrodes in the memory cell region by the self-alignment contact (hereinafter referred to as SAC) method, and filled with polycrystalline silicon, thereby forming a polycrystalline silicon plug 112.

An interlayer insulation film 113 of TEOS, etc. is then formed on the interlayer insulation film 111 as shown in FIG. 47. After that, in the logic region, contact holes reaching the source/drain regions 109 are formed, and filled with a film 114 made of titanium nitride and tungsten. The film 114 (contact holes) is patterned to form bit line contacts. Likewise, bit line contacts (not shown) reaching the polycrystalline silicon plug 112 are formed in the memory cell region.

Then, as shown in FIG. 48, after an interlayer insulation film 115 of TEOS, etc. is formed, holes reaching a portion of the polycrystalline silicon plug 112 are formed and filled with silicon nitride film sidewall spacers 116 and polycrystalline silicon 117, thereby forming storage node contacts 118.

Then, as shown in FIG. 49, an interlayer insulation film 120 of BPTEOS, etc. is laminated on a silicon nitride film 119 disposed on the surface, and subjected to CMP for planarization. The silicon nitride film 119 is used as etching stoppers. Cylindrical capacitor openings 121 reaching portions of the storage node contacts 118 are formed. The formation process is set such that the first etching stops at the surface of the silicon nitride film 119, and the second etching forms the openings in the silicon nitride film 119.

After that, as shown in FIG. 50, a polycrystalline silicon film is formed on the main surface including the surfaces of the cylindrical capacitor openings 121 and subjected to surface roughening treatment to increase its surface area. The cylindrical capacitor openings 121 are then covered with a photoresist, and the polycrystalline silicon (film) is subjected to anisotropic etching so as to leave the polycrystalline silicon only inside the cylindrical capacitor openings 121. This completes the formation of capacitor bottom electrodes 122.

Furthermore, tantalum pentoxide (not shown), for example, is formed on the main surface including the surfaces of the cylindrical capacitor openings 121 as a capacitor dielectric film, as shown in FIG. 51. Then, a film containing titanium nitride is formed and patterned by use of a photoresist, thereby forming capacitor top electrodes 123.

Then, as shown in FIG. 52, an interlayer insulation film 124 of plasma TEOS, etc. is formed on the capacitor top electrodes 123. Subsequently, in the logic circuit region, contact holes 125 are formed to expose the surfaces of the bit line contacts 114.

The contact holes 125 are then filled with titanium nitride 126 and tungsten 127, acting as barrier metals, as shown in FIG. 53.

Then, as shown in FIG. 54, aluminum wires 129 sandwiched by films of titanium 128a and 128b are formed on the contact holes.

This completes description of a method for manufacturing a semiconductor device formed by use of a conventional technique.

Description will be made below of a problem with the above conventional technique with reference to FIG. 54. Since the cell area of DRAMs has been significantly reduced in recent years, self alignment contact holes produced using the silicon nitride film 107 as their etching stoppers have been employed as the contact holes disposed between the gate electrodes in the memory cell region. In this case, the tops of the gate electrodes are covered with the silicon nitride film 107, etc. This means that the silicon nitride film 107 is also formed in the logic region, making it difficult to form cobalt silicide on the gate electrodes for the purpose of forming highly-integrated and high-performance MOS transistors in the logic circuit region.

To cope with the above problem, the gate electrodes currently have a layered structure made up of the polycrystalline silicon (layer) 104 and the tungsten silicide (layer) 105 in order to reduce the resistance. However, this structure still has a high resistance value as compared with the case where cobalt silicide is formed on the gate electrodes, preventing formation of highly-integrated and high-performance MOS transistors in the logic circuit region.

The present invention has been devised to solve the above problem and is applied to embedded DRAMs which reqire memory cells and highly-integrated and high-performance logic transistors. It is, therefore, an object of the present invention to provide a method for manufacturing a semiconductor device, in which the gate electrodes and the source/drain regions of the CMOS transistors in the logic region can be "cobalt-silicified".

SUMMARY OF THE INVENTION

According to one aspect of the present invention, in a method for manufacturing a semiconductor device having a memory cell region and a logic circuit region, in the semiconductor substrate, a first gate electrode is formed via a first gate oxide film on a first channel region, and a second gate electrode is formed via a second gate oxide film on a second channel region.

A pair of a first source/drain region and a second source/drain region are formed in such a way that the first source/drain region and the second source/drain region are spaced from each other and sandwich said first channel region therebetween, and further a pair of a third source/drain region and a fourth source/drain region are formed in such a way that the third source/drain region and the fourth source/drain region are spaced from each other and sandwich said second channel region therebetween.

A first silicon nitride film is formed on an entire surface of the semiconductor substrate in such a way that the first silicon nitride film covers the first and second gate electrodes.

The first silicon nitride film is subjected to anisotropic etching to form sidewalls on sides of the first and second gate electrodes.

A cobalt silicification-resistant film is formed on an entire surface of the semiconductor substrate in such a way that the cobalt silicification-resistant film covers the first and second gate electrodes, and the cobalt silicification-resistant film is removed from the logic circuit region including a surface of the second gate electrode.

A cobalt silicide film is formed on the third and fourth source/drain regions and the second gate electrode in the logic circuit region.

A second silicon nitride film is formed on the semiconductor substrate.

A first interlayer insulation film is formed on the second silicon nitride film.

Each of the first interlayer insulation film, the second silicon nitride film, and the cobalt silicification-resistant film over the first and second source/drain regions is etched to form a first opening and a second opening which reach the first and second source/drain regions, respectively, and the first and second openings are filled with polycrystalline silicon to form a first polycrystalline silicon plug and a second polycrystalline silicon plug.

A third silicon nitride film is formed in the memory cell region on the first interlayer insulation film.

A second interlayer insulation film is formed on the third silicon nitride film and the interlayer insulation film.

The second interlayer insulation film and the third silicon nitride film are etched to form a third opening which reaches the first polycrystalline silicon plug.

A capacitor portion is formed in the third opening.

A third interlayer insulation film is formed on the second interlayer insulation film in such a way that the third interlayer insulation film covers the capacitor portion.

The third silicon nitride film and the second and third interlayer insulation films are etched to form a fourth opening which reaches the second polycrystalline silicon plug, and further the first, second, and third interlayer insulation films are etched to form a fifth opening which reaches the third source/drain region.

The fourth and fifth openings are filled with a barrier metal and a metal to form metal plugs.

A film of aluminum sandwiched by films of titanium nitride is formed on the third interlayer insulation film, and the film of aluminum is patterned to form bit lines and aluminum wires.

According to another aspect of the present invention, in a method for manufacturing a semiconductor device having a memory cell region and a logic circuit region, in the semiconductor substrate, a first gate electrode is formed via a first gate oxide film on a first channel region, and a second gate electrode is formed via a second gate oxide film on a second channel region.

A pair of a first source/drain region and a second source/drain region are formed in such a way that the first source/drain region and the second source/drain region are spaced from each other and sandwich said first channel region therebetween, and further a pair of a third source/drain region and a fourth source/drain region are formed in such a way that the third source/drain region and the fourth source/drain region are spaced from each other and sandwich said second channel region therebetween.

A first silicon nitride film is formed on an entire surface of the semiconductor substrate in such a way that the first silicon nitride film covers the first and second gate electrodes.

The first silicon nitride film is subjected to anisotropic etching to form sidewalls on sides of the first and second gate electrodes.

A cobalt silicide film is formed on the first and second source/drain regions and the first gate electrode in the memory cell region, and on the third and fourth source/drain regions and the second gate electrode in the logic circuit region.

A second silicon nitride film is formed on the semiconductor substrate.

A first interlayer insulation film is formed on the second silicon nitride film.

Each of the first interlayer insulation film and the second silicon nitride film over the first and second source/drain regions is etched to form a first opening and a second opening which reach the first and second source/drain regions, respectively, and the first and second openings are filled with a high melting point metal film to form a first high melting point metal plug and a second high melting point metal plug.

A third silicon nitride film is formed in the memory cell region on the first interlayer insulation film.

A second interlayer insulation film is formed on the third silicon nitride film and the interlayer insulation film.

The second interlayer insulation film and the third silicon nitride film are etched to form a third opening which reaches the first high melting point metal plug.

A capacitor portion is formed in the third opening.

A third interlayer insulation film is formed on the second interlayer insulation film in such a way that the third interlayer insulation film covers the capacitor portion.

The third silicon nitride film and the second and third interlayer insulation films are etched to form a fourth opening which reaches the second high melting point metal plug, and further the first, second, and third interlayer insulation films are etched to form a fifth opening which reaches the third source/drain region.

The fourth and fifth openings are filled with a barrier metal and a metal to form metal plugs.

A film of aluminum sandwiched by films of titanium nitride is formed on the third interlayer insulation film, and the film of aluminum is patterned to form bit lines and aluminum wires.

According to another aspect of the present invention, in a method for manufacturing a semiconductor device having a memory cell region and a logic circuit region, in the semiconductor substrate, a first gate electrode is formed via a first gate oxide film on a first channel region, and a second gate electrode is formed via a second gate oxide film on a second channel region.

A pair of a first source/drain region and a second source/drain region are formed in such a way that the first source/drain region and the second source/drain region are spaced from each other and sandwich said first channel region therebetween, and further a pair of a third source/drain region and a fourth source/drain region are formed in such a way that the third source/drain region and the fourth source/drain region are spaced from each other and sandwich said second channel region therebetween.

A first silicon nitride film is formed on an entire surface of the semiconductor substrate in such a way that the first silicon nitride film covers the first and second gate electrodes.

The first silicon nitride film is subjected to anisotropic etching to form sidewalls on sides of the first and second gate electrodes.

A cobalt silicide film is formed on the first and second source/drain regions and the first gate electrode in the memory cell region, and on the third and fourth source/drain regions and the second gate electrode in the logic circuit region.

A second silicon nitride film is formed on the semiconductor substrate.

A first interlayer insulation film is formed on the second silicon nitride film.

Each of the first interlayer insulation film and the second silicon nitride film over the first, second, and third source/drain regions is etched to form a first opening, a second opening and a third opening which reach the first, second, and third source/drain regions, respectively, and the first and second openings are filled with a high melting point metal film to form a first high melting point metal plug, a second high melting point metal plug and a third high melting point metal plug.

A third silicon nitride film is formed on an entire surface of the first interlayer insulation film.

A second interlayer insulation film is formed on the third silicon nitride film.

The second interlayer insulation film and the third silicon nitride film are etched to form a fourth opening which reaches the first high melting point metal plug.

A capacitor portion is formed in the fourth opening.

A third interlayer insulation film is formed on the second interlayer insulation film in such a way that the third interlayer insulation film covers the capacitor portion.

The third silicon nitride film and the second and third interlayer insulation films are etched to form a fifth opening and a sixth opening which reaches the second and third high melting point metal plugs, respectively.

The fifth and sixth openings are filled with a barrier metal and a metal to form metal plugs.

A film of aluminum sandwiched by films of titanium nitride is formed on the third interlayer insulation film, and the film of aluminum is patterned to form bit lines and aluminum wires.

Other and further objects, features and advantages of the invention will appear more fully from the following description.

DESCRIPTION OF THE PREFERRED EMBODIMENTS

Description will be made below of preferred embodiments of the present invention with the accompanying drawings. In the schematic cross-sectional views of the embodiments, the left hand side shows the memory cell region, while the right hand side shows the logic circuit region.

First Embodiment

Description will be made below of a method for manufacturing an embedded DRAM according to a first embodiment of the present invention with reference to FIGS. 1 to 13.

Figure 1:
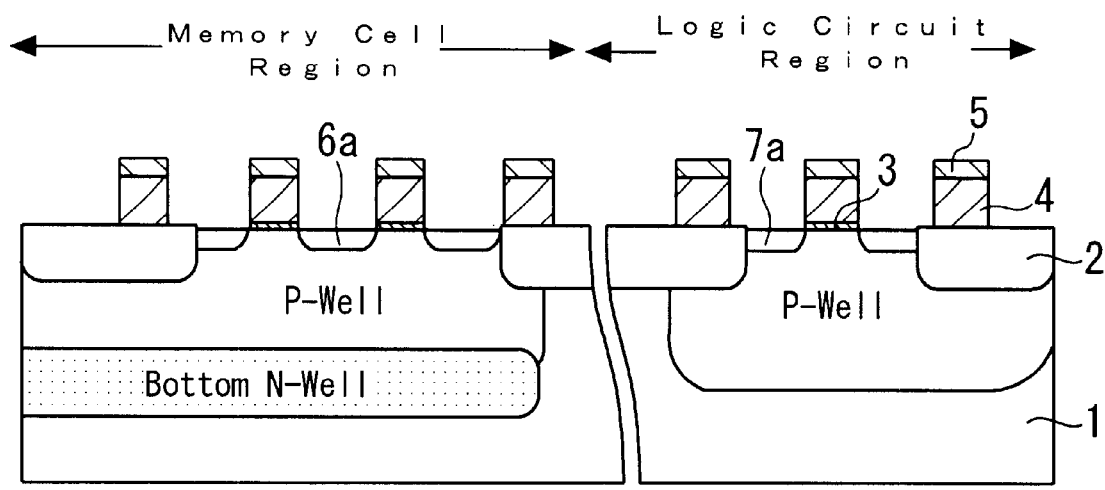
FIG. 1~FIG. 13 are each a structure of cross section showing a method for manufacturing a semiconductor device according to a first embodiment of the invention.

First of all, a separation oxide film 2 is formed on a semiconductor substrate 1 as shown in FIG. 1. Then, N-type impurities such as phosphor (P) are implanted in the memory cell region with high energy using a photoresist (not shown) as a mask to form the bottom N-well layer (the bottom surface separation layer).

After that, the logic circuit region is covered with a photoresist (not shown), and P-type impurities such as boron (B) are implanted in the memory region to form a P-well region. P-type impurities such as boron (B) are also implanted in the logic circuit region, forming a P-well region. Furthermore, an N-well region (not shown) for forming PMOSs is formed in the logic circuit region.

After the well implantation and channel implantation for the transistors are thus carried out, a gate oxide film 3 is formed on the semiconductor substrate 1 by a thermal oxidation method, etc. A polycrystalline silicon film and a silicon oxide film 4 of TEOS, etc. is then formed on the gate oxide film 3 and patterned. The polycrystalline silicon film is used as gate electrodes, while the silicon oxide film 4 of TEOS, etc. are used as etching masks for forming the gate electrode 4. Furthermore, N-type impurities such as phosphor (P) are implanted by an ion implantation method to form source/drain regions 6a and 7a which are low-concentration impurity layers (N⁻ layers).

Figure 2:
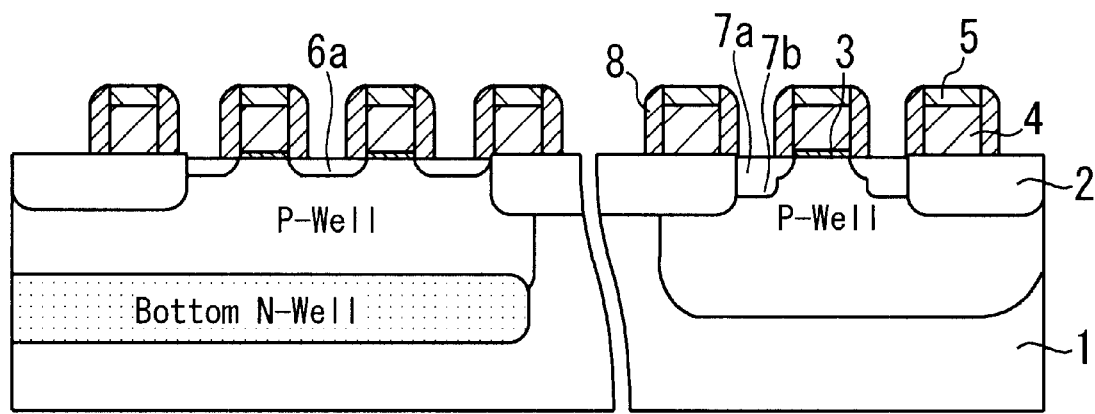

Then, as shown in FIG. 2, a silicon nitride film is formed, and anisotropic etching is carried out, thereby forming sidewall spacer silicon nitride films 8 on the sidewalls of the gate electrodes 4. Furthermore, in the logic circuit region, N-type impurities such as arsenic (As) are implanted over the sidewall spacer silicon nitride films 8 to form a source/drain region 7b which is a high-concentration impurity layer (N⁺ layer).

Figure 3:
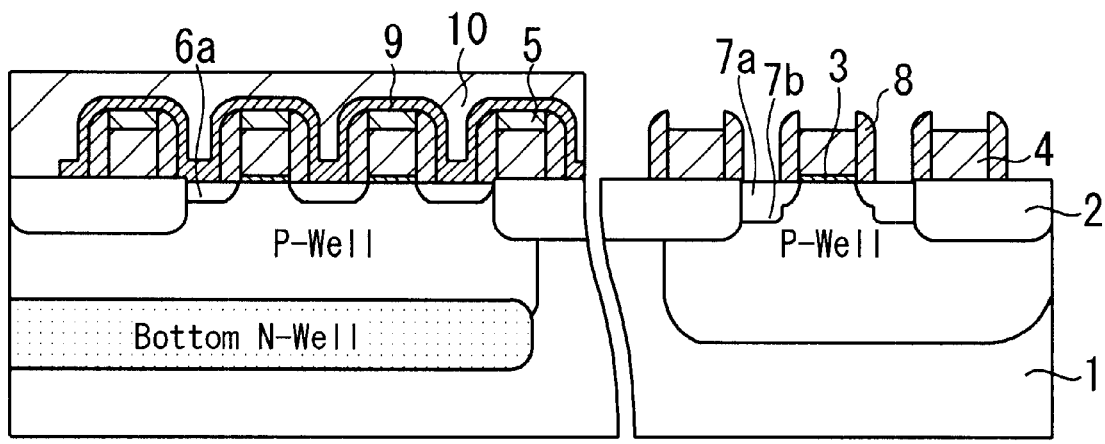

As shown in FIG. 3, an undoped silicate glass film 9 (hereinafter referred to as USG) is formed and etched using a resist pattern 10 as a mask, removing at least the portions of the USG formed on the source/drain regions 7a and 7b in the regions other than the memory cell region and the silicon oxide film 5 and the portion of the USG formed on the gate electrodes 4. The USG acts as a cobalt silicification reaction-resistant film.

Figure 4:
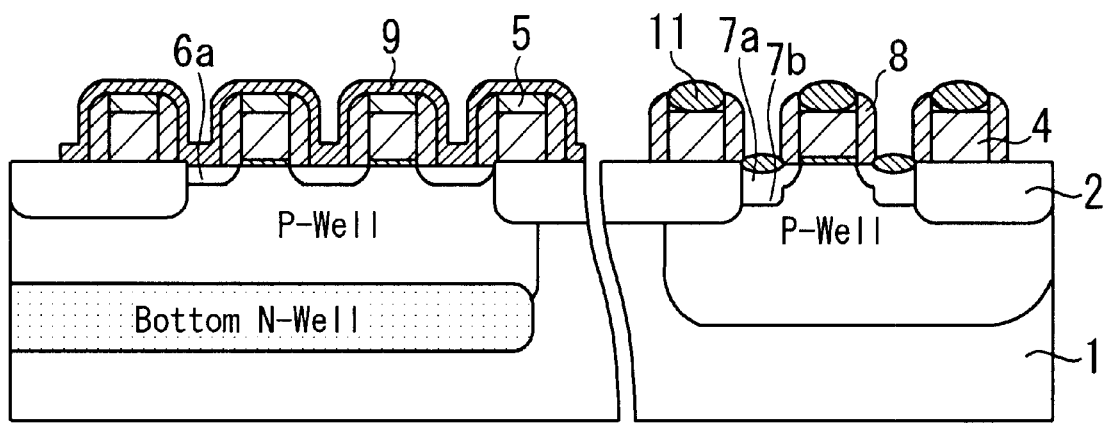

Furthermore, as shown in FIG. 4, a film of cobalt is formed on the entire surface of the wafer by a sputtering method and then subjected to heat treatment such as ramp annealing to form a cobalt silicide film 11 (whose resistance is low) on the source/drain regions 7a and 7b and the gate electrodes 4, which are not covered with the USG.

Figure 5:
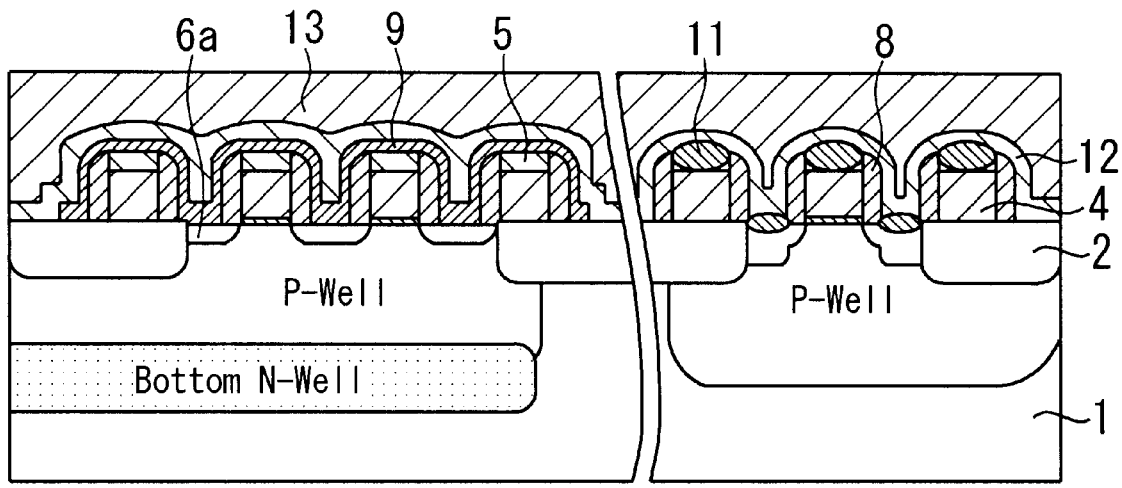

Then, as shown in FIG. 5, an interlayer insulation film 13 of BPTEOS, etc. is laminated on a silicon nitride film 12 disposed on the surface, and subjected to heat treatment for planarization. The silicon nitride film 12 acts as an etching stopper film for exposing contacts in the logic circuit region.

Figure 6:
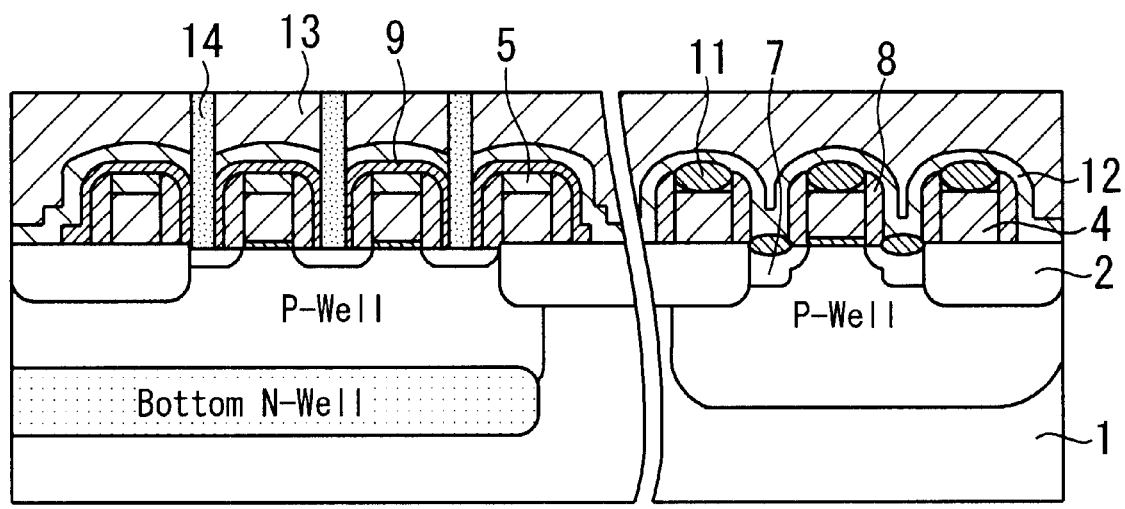

After that, as shown in FIG. 6, contact holes reaching the semiconductor substrate 1 are formed between the gate electrodes 4 in the memory cell region and filled with polycrystalline silicon, thereby forming polycrystalline silicon plugs 14.

It should be noted that this contact hole formation process does not employ the SAC method, which can realize a self alignment structure with respect to the gate electrodes.

Figure 7:
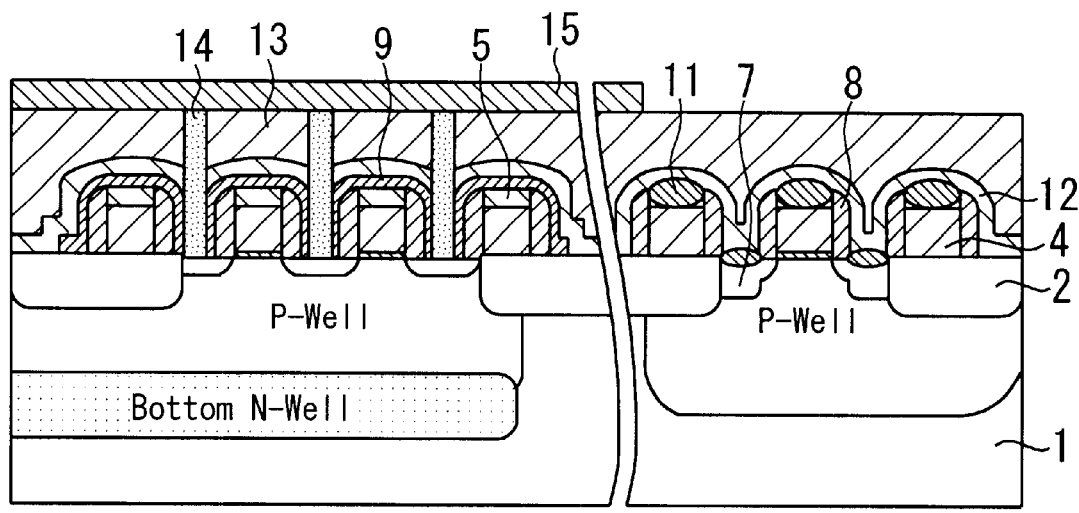

As shown in FIG. 7, a silicon nitride film 15 is formed on the interlayer insulation film 13 such that it covers the entire memory cell region. The silicon nitride film 15 acts as an etching stopper film for contact holes formed on the polycrystalline silicon plugs 14 in a subsequent process. The silicon nitride film 15 is formed to have a film thickness thicker than that of the silicon nitride film 12.

Figure 8:
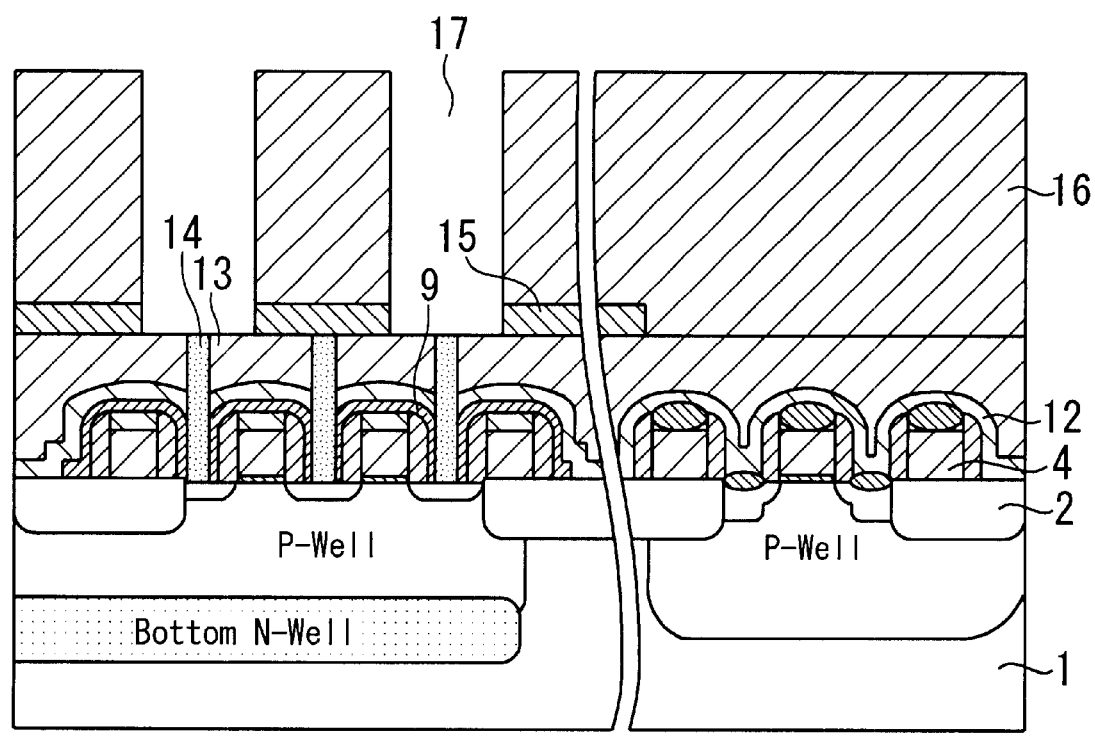

Furthermore, as shown in FIG. 8, an interlayer insulation film 16 of BPTEOS, etc. is laminated on the surface and planarized by way of CMP (polishing). The interlayer insulation film 16 is then etched using the silicon nitride film 15 as an etching stopper to form openings (which are portions of cylindrical capacitor openings 17 to be completed in the subsequent process). Subsequently, the silicon nitride film 15 is also etched so as to complete the formation of the cylindrical capacitor openings 17 reaching portions of the top surfaces of the polycrystalline silicon plugs 14.

Figure 9:
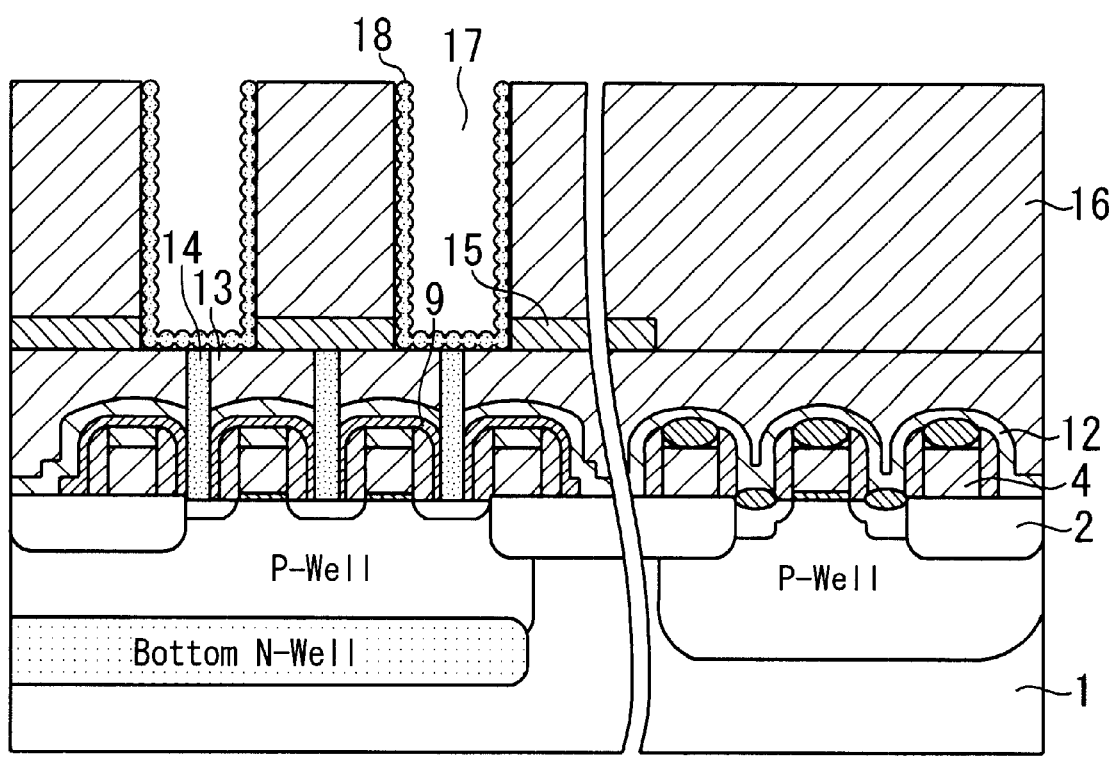

After that, as shown in FIG. 9, a polycrystalline silicon film is formed on the surface of the interlayer insulation film 16 including the surfaces of the cylindrical capacitor openings 17 and subjected to surface treatment to increase its surface area. The cylindrical capacitor openings 17 are then covered with a photoresist. In this state, the polycrystalline silicon film is subjected to anisotropic etching so as to leave the polycrystalline silicon film only inside the cylindrical capacitor openings 17. This completes the formation of capacitor bottom electrodes 18.

Figure 10:
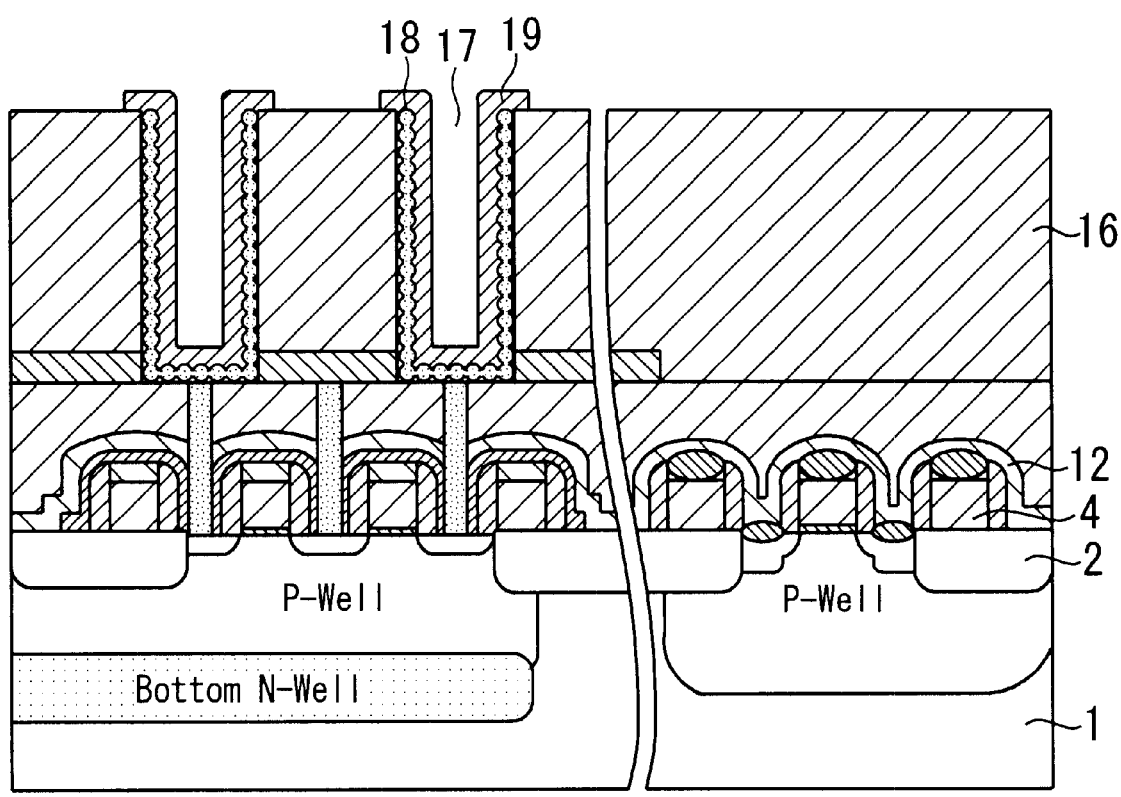

Furthermore, tantalum pentoxide (not shown), for example, is formed on the surface including the surfaces of the cylindrical capacitor openings 17 as shown in FIG. 10. Then, a film containing titanium nitride is formed and patterned by use of a photoresist. The tantalum pentoxide is used as a capacitor dielectric film, while the film containing titanium nitride is used as capacitor top electrodes 19.

Figure 11:
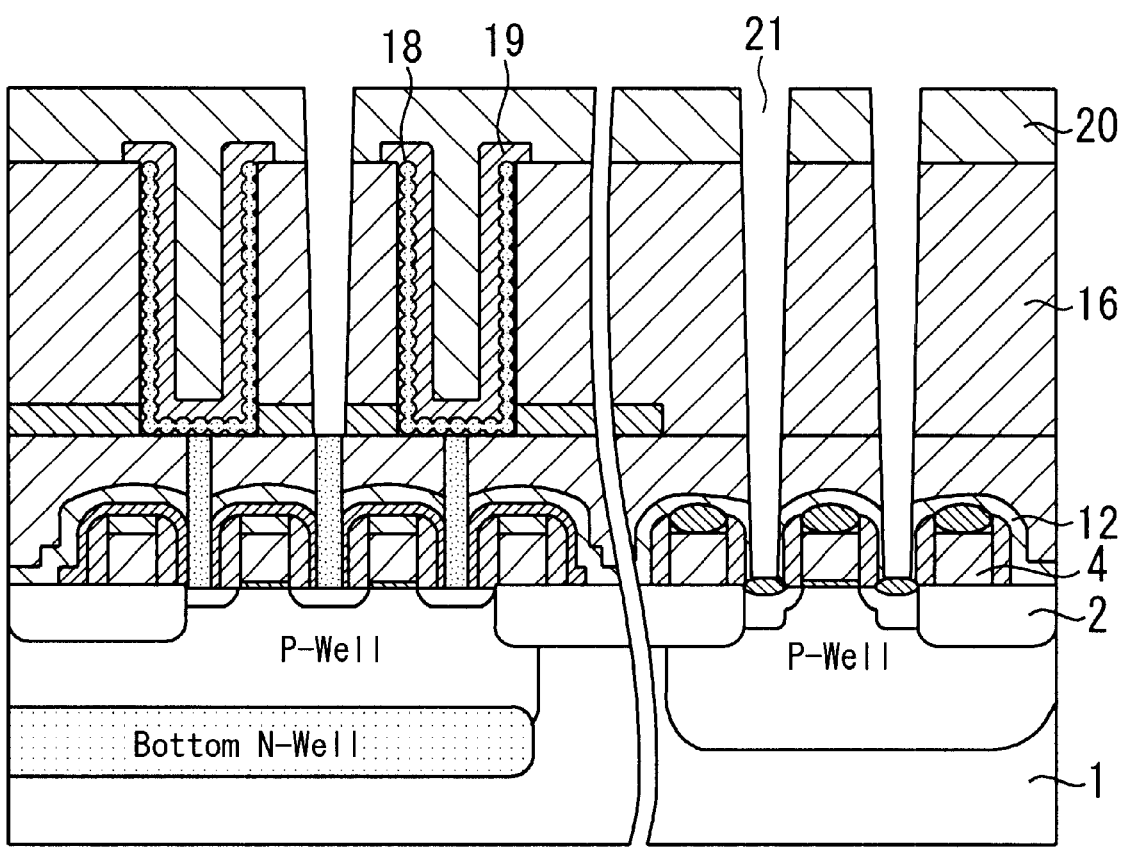

Then, as shown in FIG. 11, an interlayer insulation film 20 of plasma TEOS, etc. is formed on the capacitor top electrodes 19 and planarized by way of CMP (polishing). Subsequently, contact holes are formed such that they reach the polycrystalline silicon plugs 14 and capacitor top electrodes 18 (not shown) in the memory cell region and the source/drain regions 7a and 7b and the tops (not shown) of the gate electrodes in the logic circuit region.

The above formation process is set such that the first etching stops at a position inside the silicon nitride film 15 in the memory cell region and at a position inside the silicon nitride film 12 in the logic circuit region, and the second etching finally forms the openings in the silicon nitride films 12 and 15. Since the silicon nitride film 15 is disposed at a position higher than that of the silicon nitride film 12, the silicon nitride film 15 is etched more than the silicon nitride film 12 is etched. Therefore, the film thickness of the silicon nitride film 15 is set to be thicker than the film thickness of the silicon nitride film 12.

Figure 12:
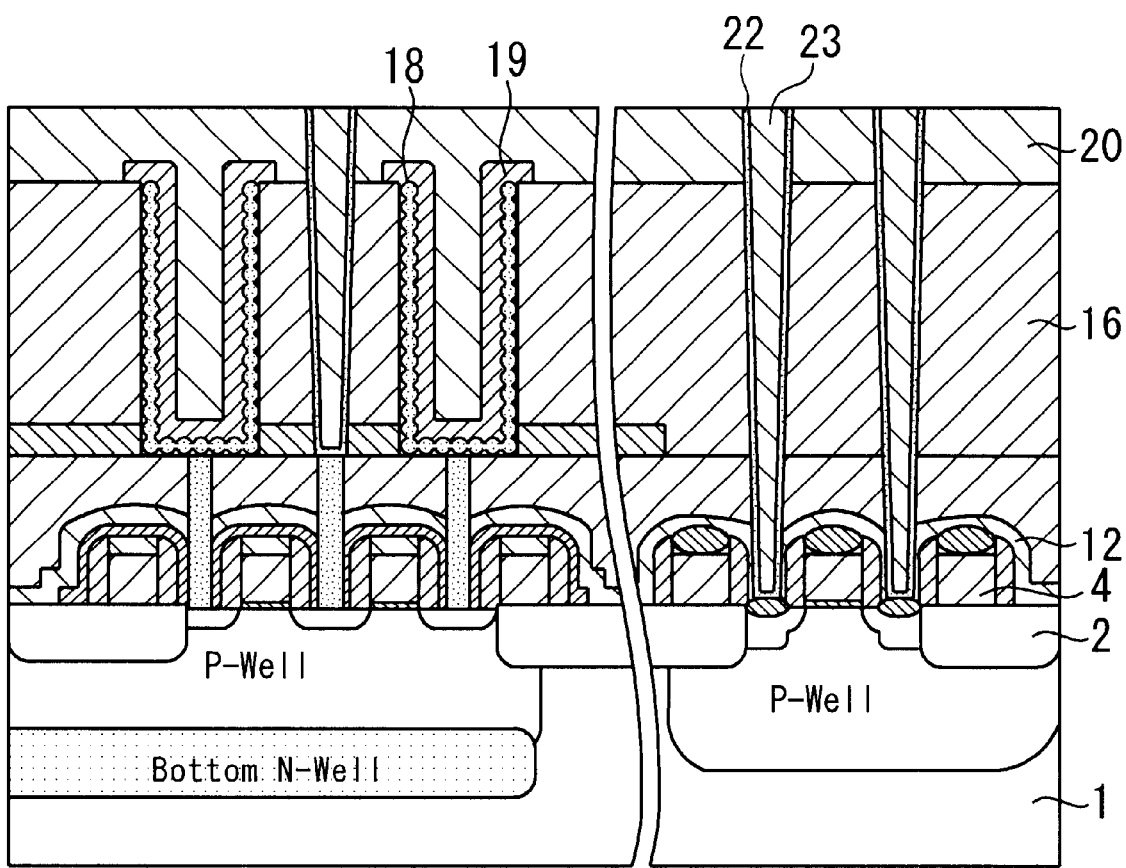

Then, as shown in FIG. 12, contact holes 21 are filled with titanium nitride 22 and a metal such as tungsten 23, acting as barrier metals, to form metal plugs.

Figure 13:
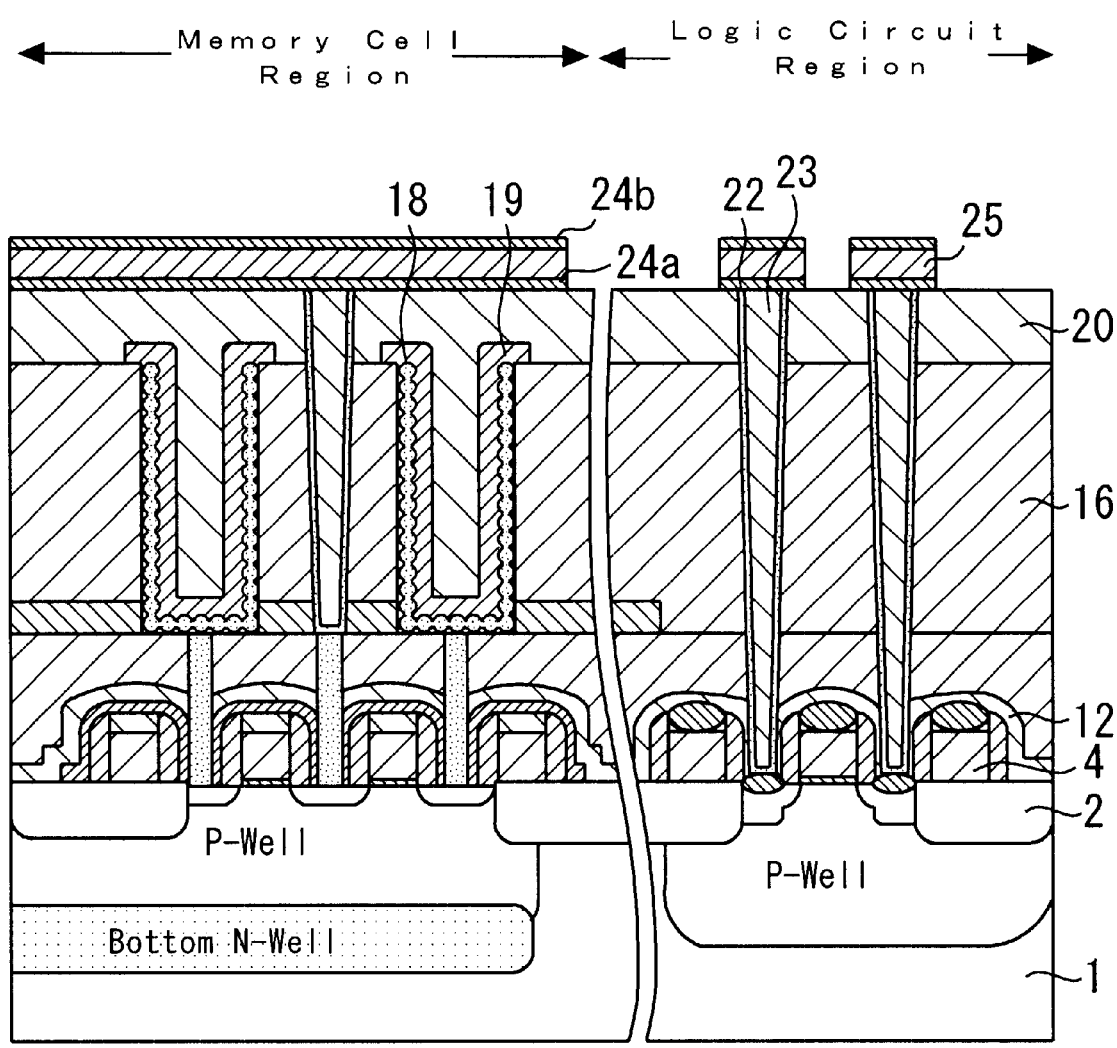

After that, as shown in FIG. 13, a film of aluminum sandwiched by films of titanium nitride 24a and 24b is formed and patterned to form bit lines 25 in the memory cell region. Furthermore, aluminum wires are formed in the logic circuit region. The semiconductor device thus formed has a CUB (Capacitor Under Bit-line) structure in which the capacitor portions are disposed under the bit lines 25.

According to the first embodiment, as shown in FIG. 13, the cobalt silicide film 11 is formed on the source/drain regions 7a and 7b and the gate electrodes 4 of the transistors in the logic circuit region. With this arrangement, it is possible to produce a high-performance and highly integrated logic circuit.

Furthermore, since the memory cell region has a CUB structure, the bit lines are formed on the same layer as that for the aluminum wires in the logic circuit region, making it possible to reduce the number of processes to be employed.

Second Embodiment

Figure 14:
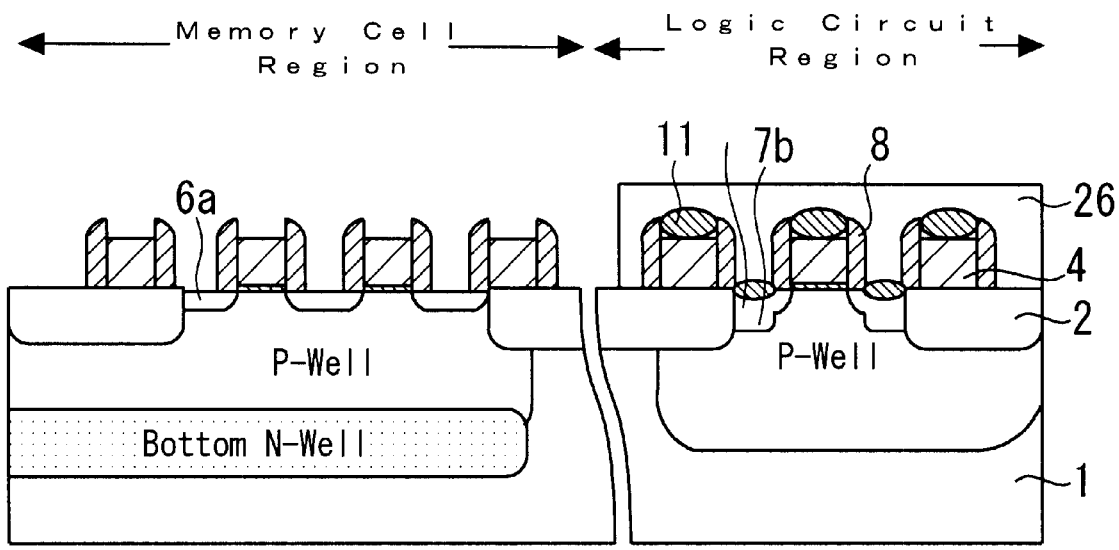
FIG. 14~FIG. 23 are each a structure of cross section showing a method for manufacturing a semiconductor device according to a second embodiment of the invention.

Description will be made below of a method for manufacturing a semiconductor device according to a second embodiment of the present invention with reference to FIGS. 14 to 23. The manufacturing method of the second embodiment performs the same processes as those shown in FIGS. 1 to 4 for the first embodiment before obtaining the structure shown in FIG. 14. According to the second embodiment, as shown in FIG. 14, the logic circuit region in which the cobalt silicide film 11 is formed is then covered with a photoresist pattern 26. In this state, all of the remaining USG 9 is removed by use of hydrofluoric acid, etc.

Figure 15:
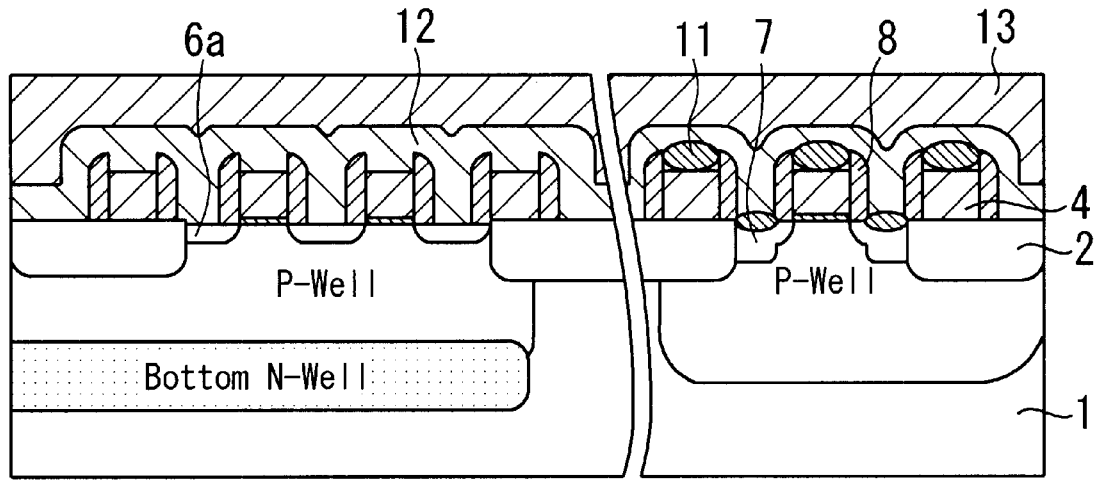

Then, as shown in FIG. 15, an interlayer insulation film 13 of BPTEOS, etc. is laminated on a silicon nitride film 12 formed on the surface, and subjected to heat treatment for planarization. The silicon nitride film 12 acts as an etching stopper film for exposing contacts in the logic circuit region.

Figure 16:
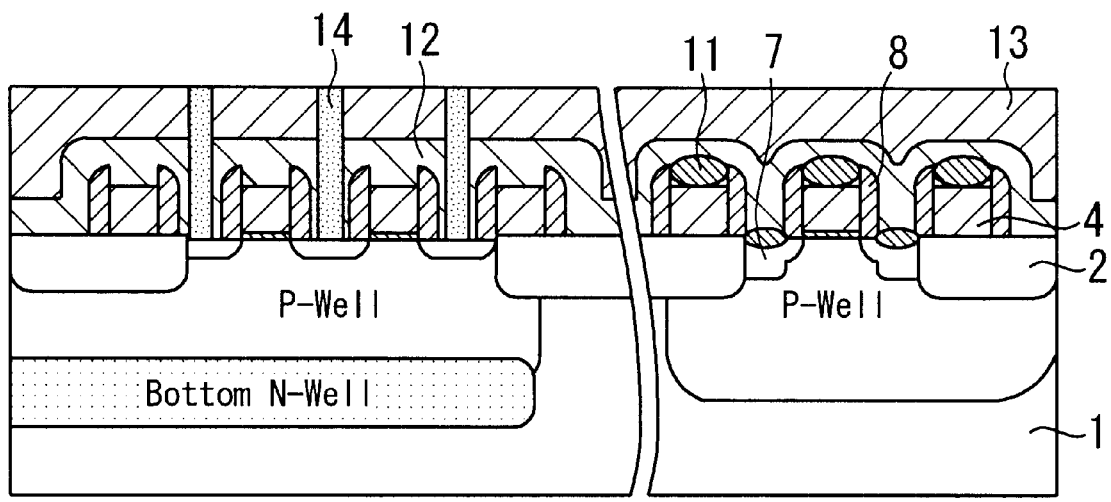

After that, as shown in FIG. 16, contact holes reaching the semiconductor substrate 1 are formed between the gate electrodes 4 in the memory cell region and filled with polycrystalline silicon, thereby forming polycrystalline silicon plugs 14.

Figure 17:
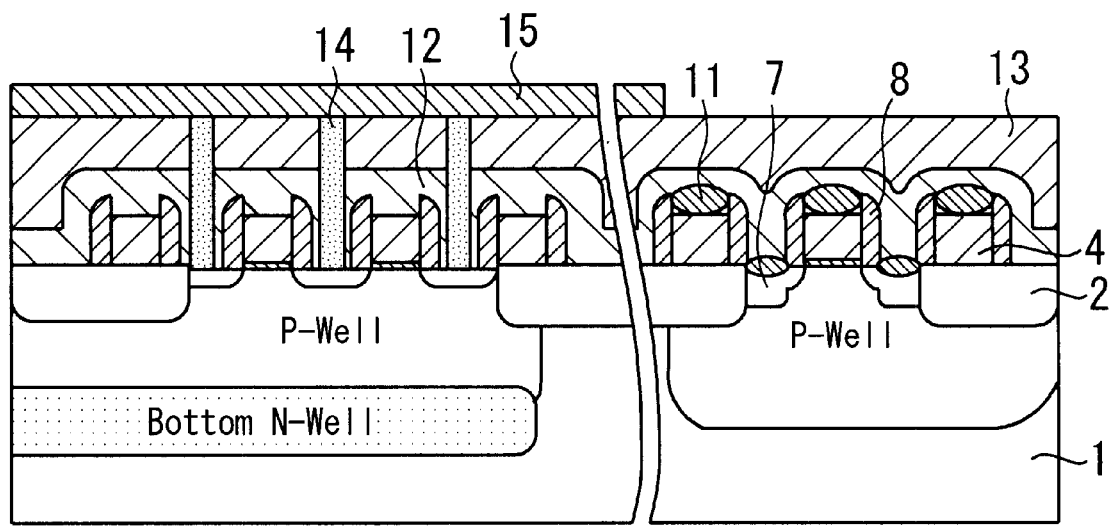

Then, as shown in FIG. 17, a silicon nitride film 15 is formed on the interlayer insulation film 13 such that it covers the entire memory cell region. The silicon nitride film 15 acts as an etching stopper film for contact holes formed on the polycrystalline silicon plugs 14 in a subsequent process. The silicon nitride film 15 is formed to have a film thickness thicker than that of the silicon nitride film 12.

Figure 18:
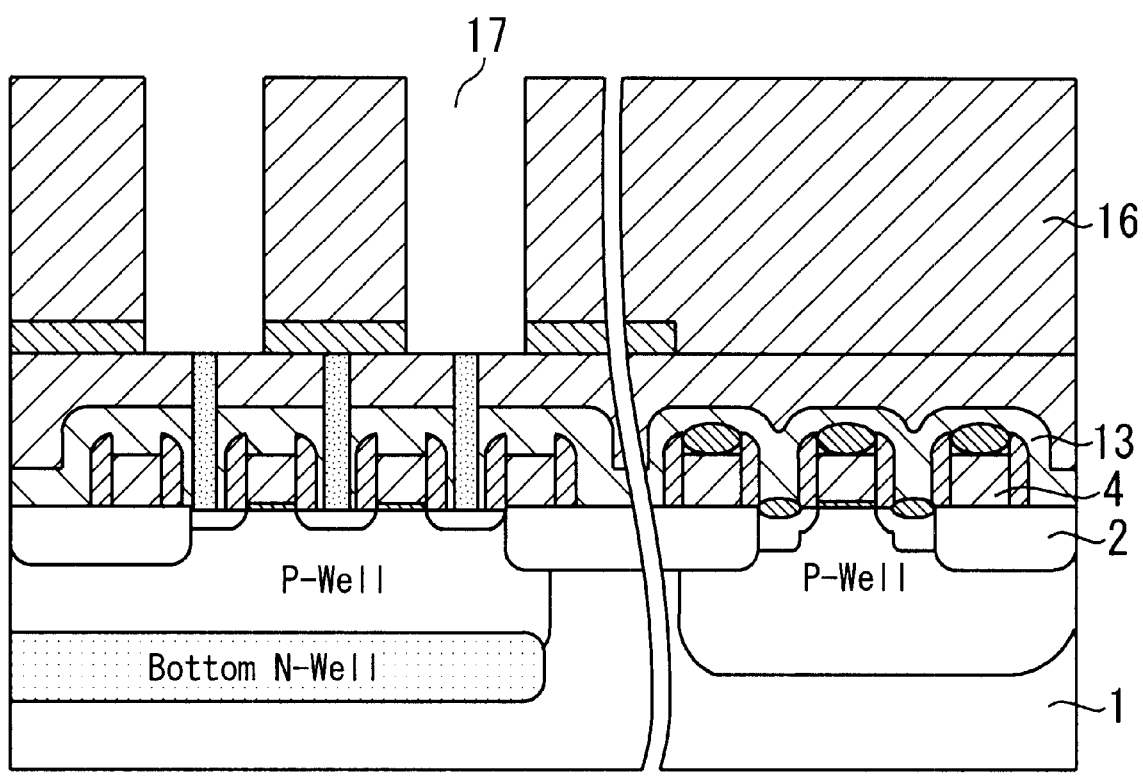

Furthermore, as shown in FIG. 18, an interlayer insulation film 16 of BPTEOS, etc. is laminated on the surface and planarized by way of CMP (polishing). The interlayer insulation film 16 is then etched using the silicon nitride film 15 as an etching stopper to form openings (which are portions of cylindrical capacitor openings 17 to be completed in the subsequent process). Subsequently, the silicon nitride film 15 is also etched so as to complete the formation of the cylindrical capacitor openings 17 reaching portions of the top surfaces of the polycrystalline silicon plugs 14.

Figure 19:
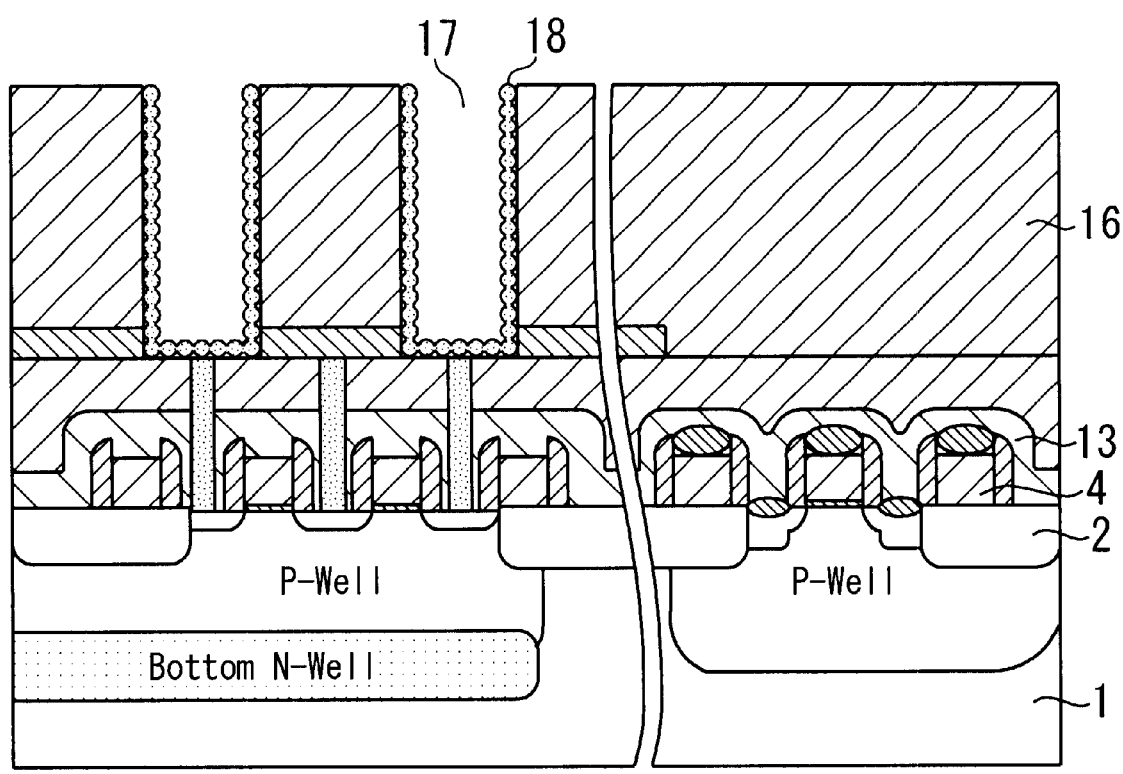

After that, as shown in FIG. 19, a polycrystalline silicon film is formed on the surface of the interlayer insulation film 16 including the surfaces of the cylindrical capacitor openings 17 and subjected to surface treatment to increase its surface area. The cylindrical capacitor openings 17 are then covered with a photoresist. In this state, the polycrystalline silicon film is subjected to anisotropic etching so as to leave the polycrystalline silicon film only inside the cylindrical capacitor openings 17. This completes the formation of capacitor bottom electrodes 18.

Figure 20:
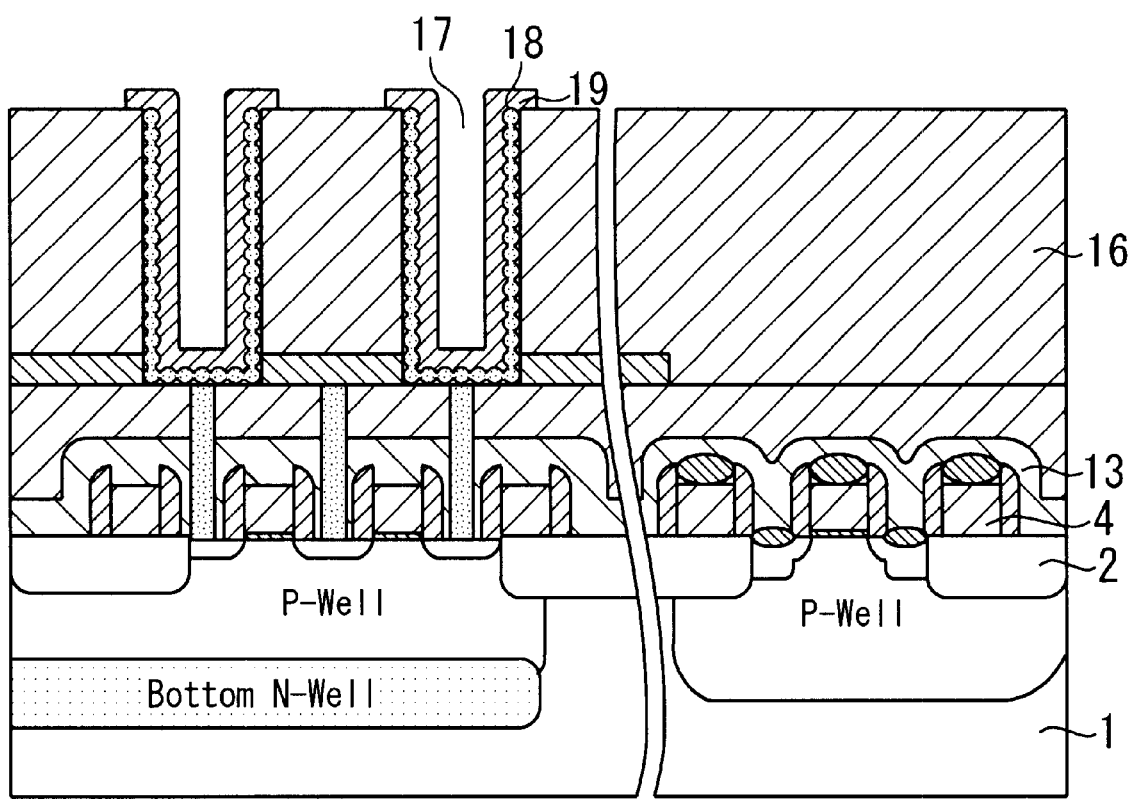

Furthermore, tantalum pentoxide (not shown), for example, is formed on the surface including the surfaces of the cylindrical capacitor openings 17 as shown in FIG. 20. Then, a film containing titanium nitride, etc. is formed and patterned by use of a photoresist. The tantalum pentoxide is used as a capacitor dielectric film, while the film containing titanium nitride is used as capacitor top electrodes 19.

Figure 21:
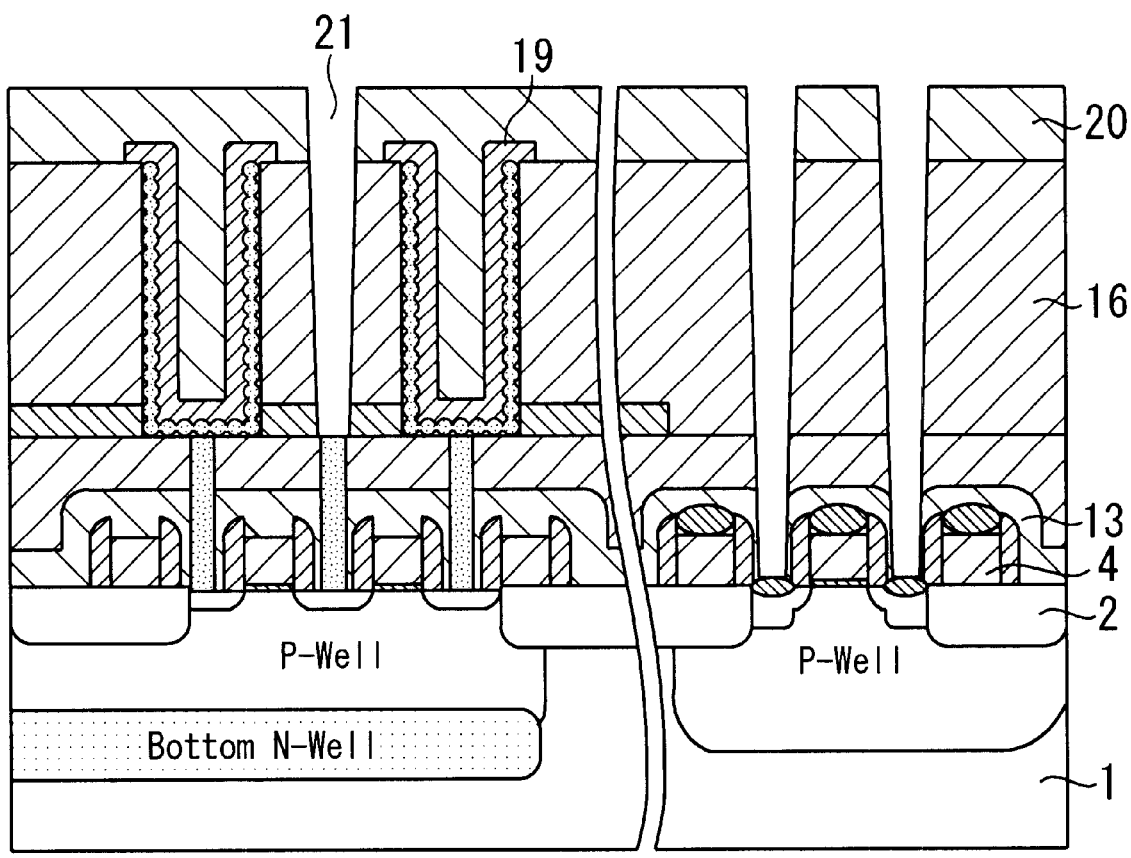

Then, as shown in FIG. 21, an interlayer insulation film 20 of plasma TEOS, etc. is formed on the capacitor top electrodes 19 and planarized by way of CMP (polishing). Subsequently, contact holes are formed such that they reach the polycrystalline silicon plugs 14 and capacitor top electrodes 18 (not shown) in the memory cell region and the source/drain regions 7a and 7b and the tops (not shown) of the gate electrodes in the logic circuit region.

The above formation process is set such that the first etching stops at a position inside the silicon nitride film 15 in the memory cell region and at a position inside the silicon nitride film 12 in the logic circuit region, and the second etching finally forms the openings in the silicon nitride films 12 and 15. Since the silicon nitride film 15 is disposed at a position higher than the position of the silicon nitride film 12, the silicon nitride film 15 is etched more than the silicon nitride film 12 is etched. Therefore, the film thickness of the silicon nitride film 15 is set to be thicker than the film thickness of the silicon nitride film 12.

Figure 22:
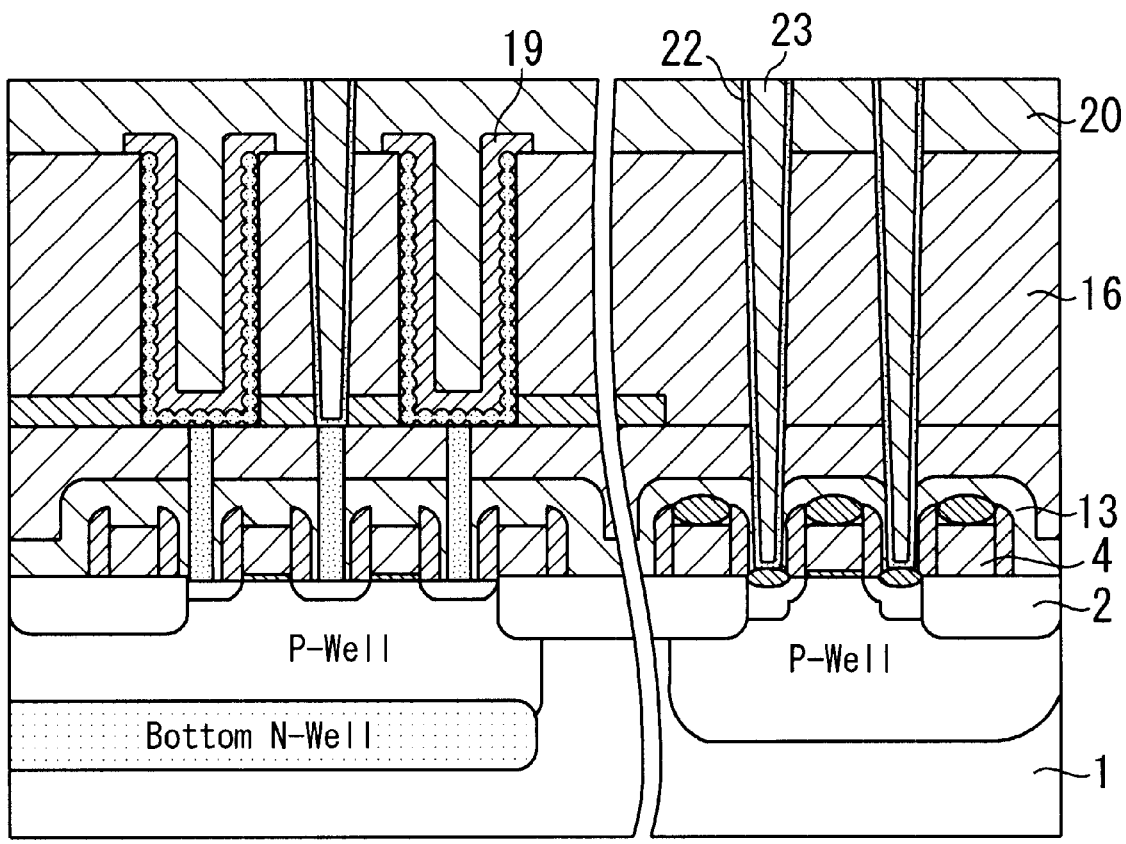

Then, as shown in FIG. 22, contact holes 21 are filled with titanium nitride 22 and a metal such as tungsten 23, acting as barrier metals, to form metal plugs.

Figure 23:
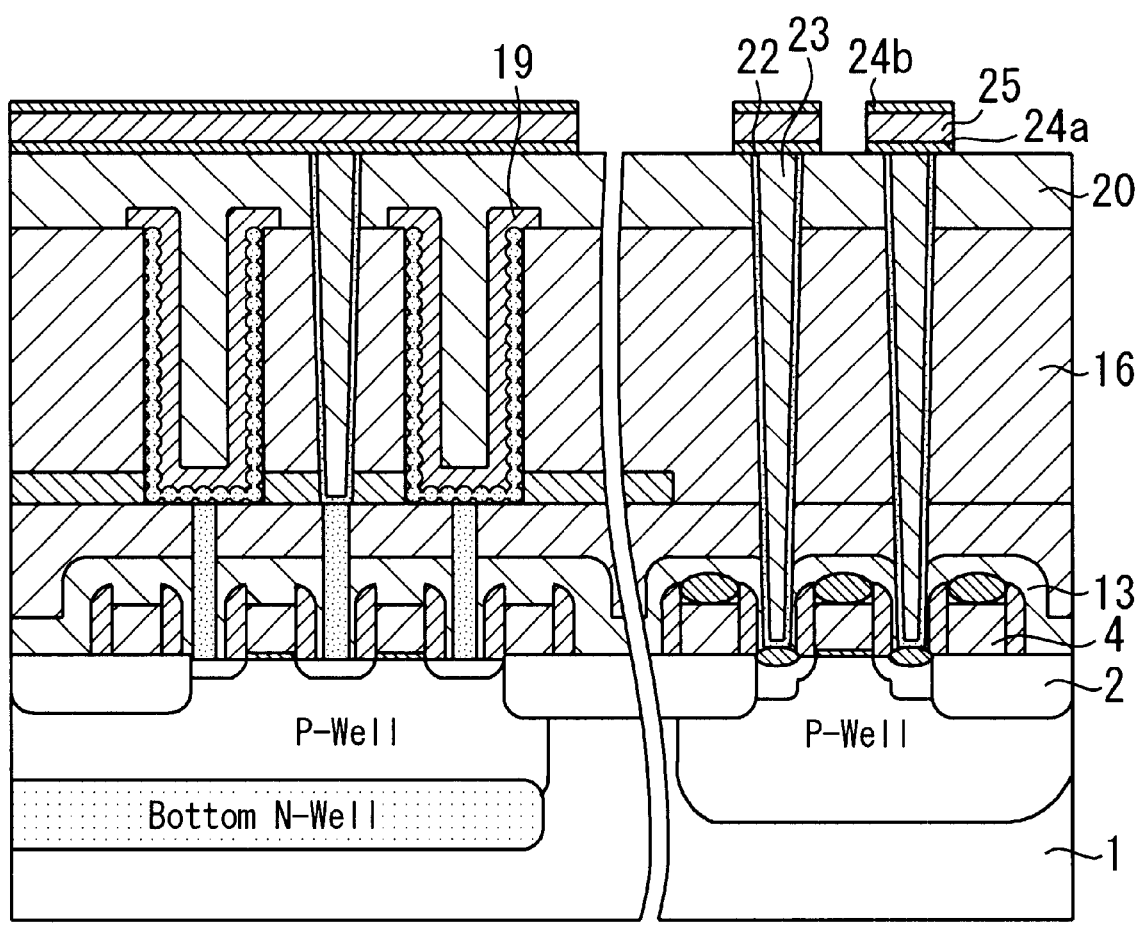

After that, as shown in FIG. 23, a film of aluminum sandwiched by films of titanium nitride 24a and 24b is formed and patterned to form bit lines in the memory cell region. Furthermore, aluminum wires are formed in the logic circuit region. The semiconductor device thus formed has a CUB (Capacitor Under Bit-line) structure in which the capacitor portions are disposed under bit lines 25.

The second embodiment produces the same effect as that of the first embodiment. Furthermore, since the USG 9, which is a cobalt silicification reaction-resistant film, is removed, the height difference between the memory cell region and the logic circuit region is reduced, thereby reducing the photolithographic margin for the upper layers, which leads to increased yield.

The first embodiment is disadvantageous in that the cobalt silicification reaction-resistant film USG9 contains a small amount of residual cobalt which has not reacted in the process shown in FIG. 4. When the contact holes between the gate electrodes in the memory cell region are formed, this residual cobalt may act as a catalyst and cause unwanted etching of the semiconductor substrate 1, significantly etching it, which leads to reduced yield. However, since the second embodiment removes the USG 9 from the memory cell region, the reduction in the yield can be prevented.

Third Embodiment

Figure 24:
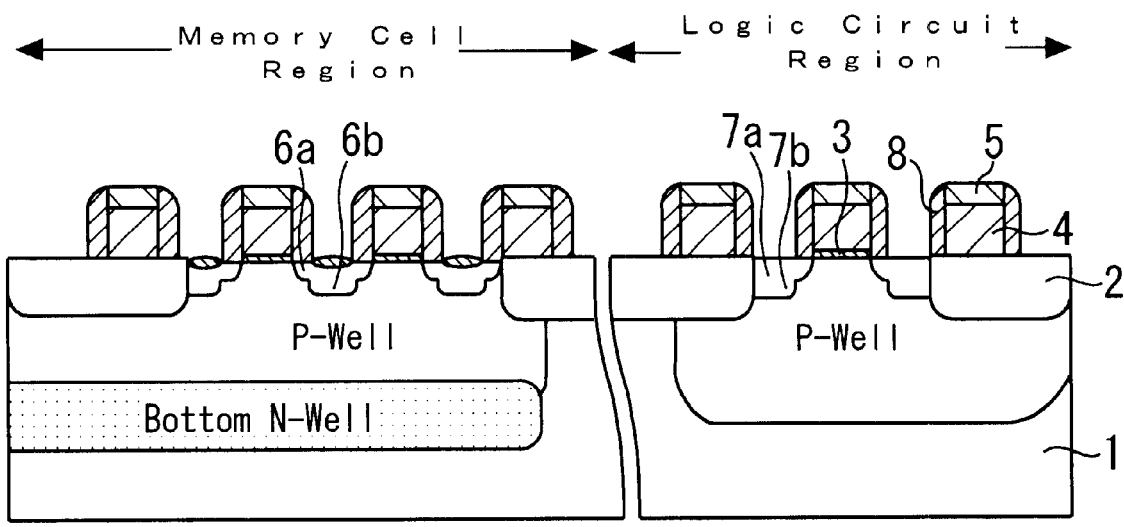
FIG. 24~FIG. 35 are each a structure of cross section showing a method for manufacturing a semiconductor device according to a third embodiment of the invention.

Description will be made below of a method for manufacturing a semiconductor device according to a third embodiment of the present invention with reference to FIGS. 24 to 35. The manufacturing method of the third embodiment performs the same processes as those shown in FIGS. 1 and 2 for the first embodiment before obtaining the structure shown in FIG. 24. Then, in the third embodiment, as shown in FIG. 24, N-type impurities such as arsenic (As) are ion-implanted over the sidewall spacer silicon nitride films 8 in the memory cell region to form a source/drain region 6b which is a high-concentration impurity layer ($N^+$ layer).

The high-concentration impurity layer 6b in the memory cell region is formed in a region deeper than the low-concentration impurity layer 7a. This arrangement reduces the increase in the junction leak caused by forming the cobalt silicide film 11 on the semiconductor substrate 1.

Furthermore, the high-concentration impurity layer 6b in the memory cell region is set to have a concentration lower than that of the high-concentration impurity layer 7b in the logic circuit region. This arrangement is made because if the concentration is too high, the leak current in the channel direction increases and as a result the refresh characteristics will be deteriorated.

Figure 25:
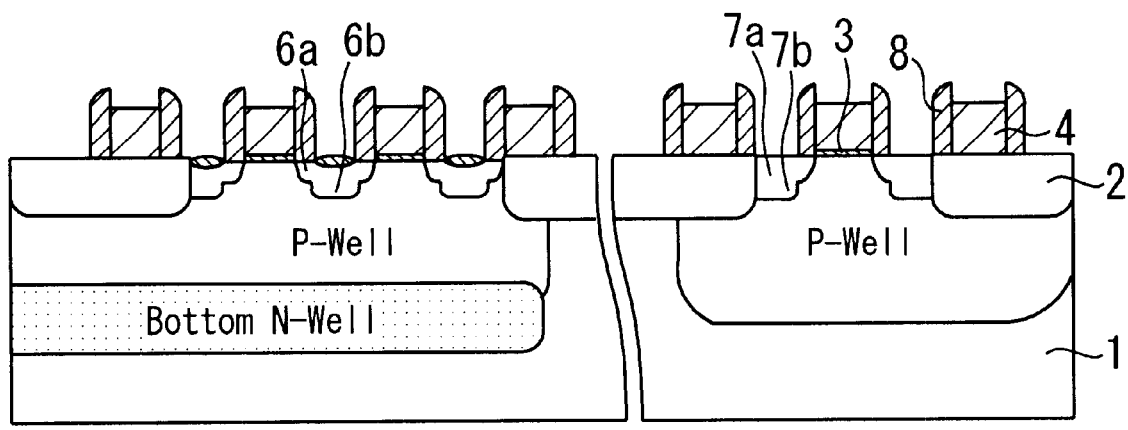
Figure 26:
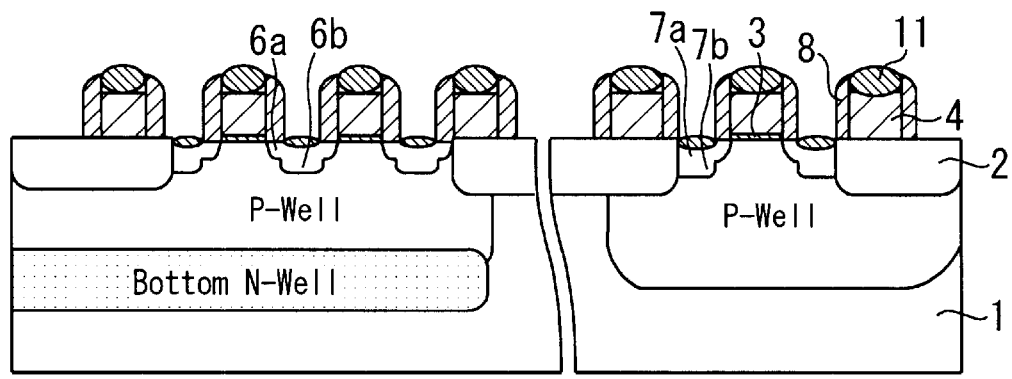

Then, as shown in FIG. 25, the silicon oxide film 5 on the gate electrodes 4 is removed by use of hydrofluoric acid. After that, a film of cobalt is formed on the entire surface of the semiconductor substrate 1 by a sputtering method and subjected to heat treatment such as ramp annealing to form a cobalt silicide film 11 (whose resistance is low) on the source/drain regions 6 (6a and 6b) and 7 (7a and 7b) and the gate electrodes 4.

Figure 27:
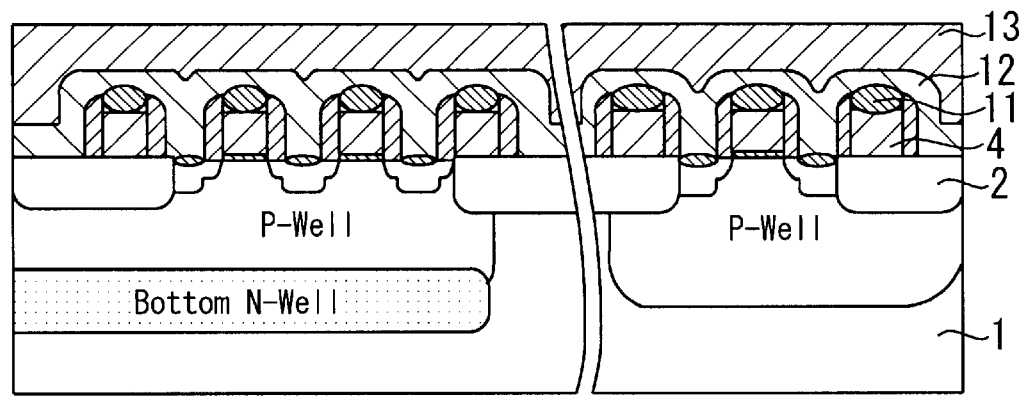

Then, as shown in FIG. 27, an interlayer insulation film 13 of BPTEOS, etc. is laminated on a silicon nitride film 12 formed on the surface, and subjected to heat treatment for planarization. The silicon nitride film 12 acts as an etching stopper film for exposing contacts in the logic circuit region.

Figure 28:
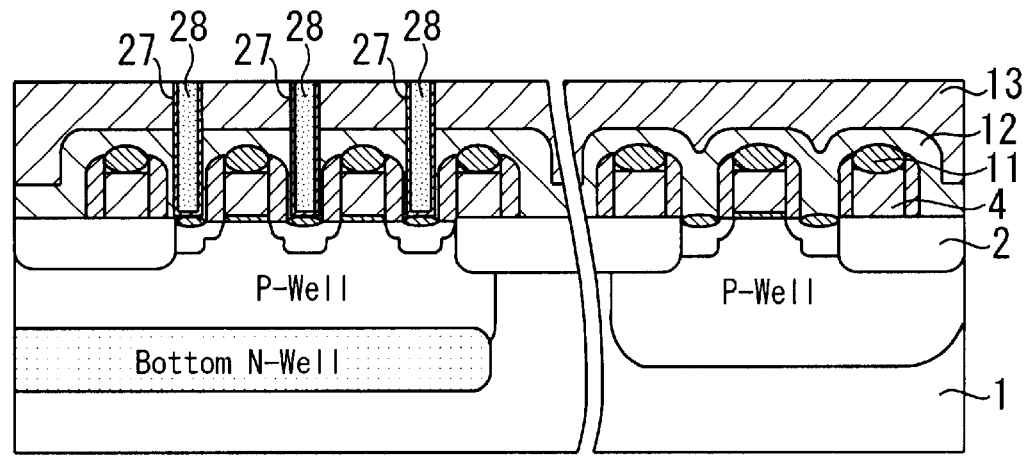

After that, as shown in FIG. 28, contacts holes reaching the source/drain regions 6a and 6b of the transistors in the memory cell region are formed. Then, barrier metals 27 of titanium nitride, etc. and high melting point metal plugs 28 of titanium or tungsten are formed inside the contact holes.

Figure 29:
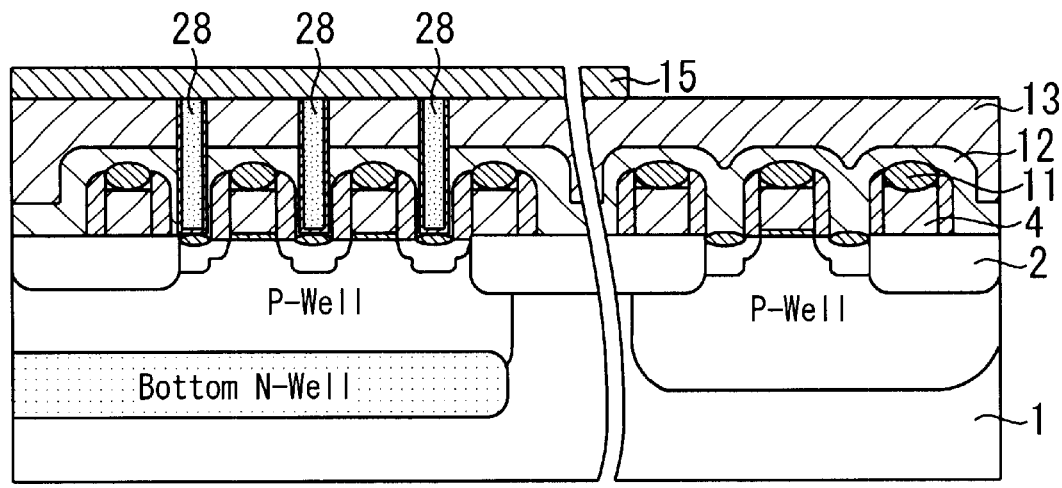

Then, as shown in FIG. 29, a silicon nitride film 15 is formed on the interlayer insulation film 13 such that it covers the entire memory cell region. The silicon nitride film 15 acts as an etching stopper film for contact holes formed in a subsequent process. The silicon nitride film 15 is formed to have a film thickness thicker than that of the silicon nitride film 12.

Figure 30:
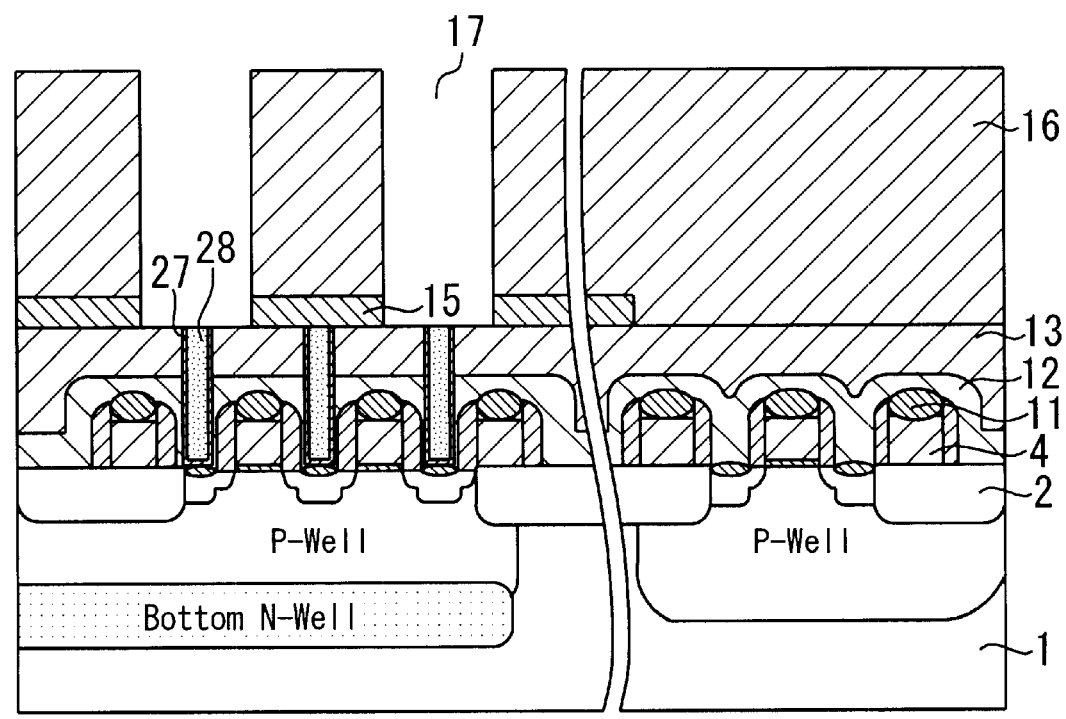

Furthermore, as shown in FIG. 30, an interlayer insulation film 16 of BPTEOS, etc. is laminated on the surface and planarized by way of CMP (polishing). The interlayer insulation film 16 is then etched using the silicon nitride film 15 as an etching stopper to form openings (which are portions of cylindrical capacitor openings 17 to be completed in the subsequent process). Subsequently, the silicon nitride film 15 is also etched so as to complete the formation of the cylindrical capacitor openings 17 reaching portions of the top surfaces of the high melting point metal plugs 28.

Figure 31:
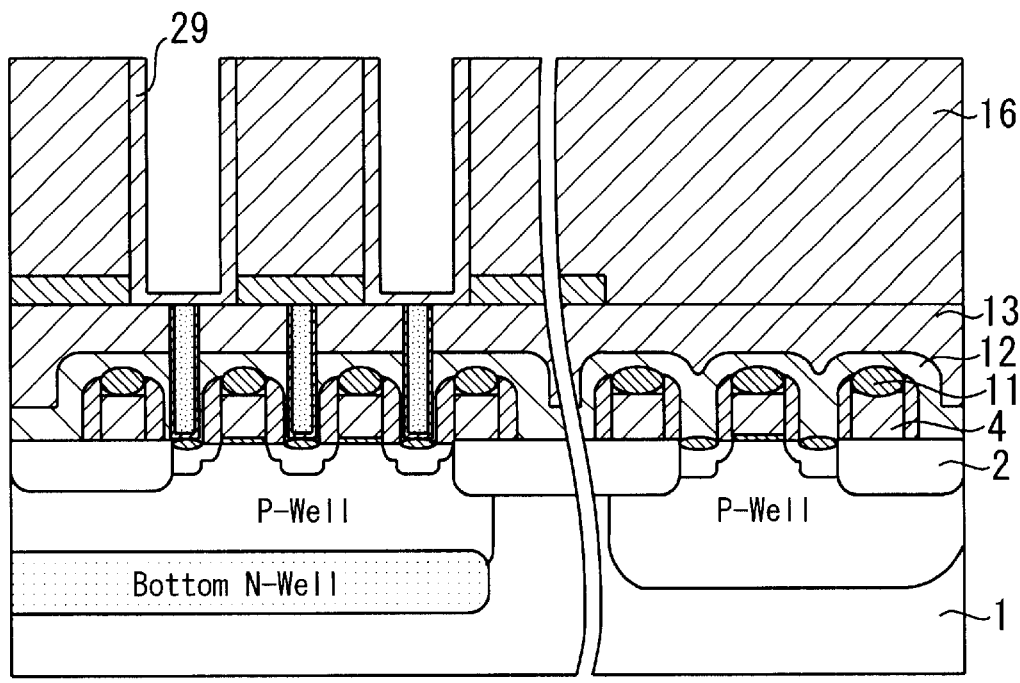

After that, as shown in FIG. 31, a film containing a high melting point metal such as ruthenium is formed on the surface of the interlayer insulation film 16 including the surfaces of the cylindrical capacitor openings 17. The cylindrical capacitor openings 17 are then covered with a photoresist (not shown). In this state, the film containing a high melting point metal is subjected to anisotropic etching so as to leave the film (containing a high melting point metal such as ruthenium) only inside the cylindrical capacitor openings 17. This completes the formation of capacitor bottom electrodes 29.

Figure 32:
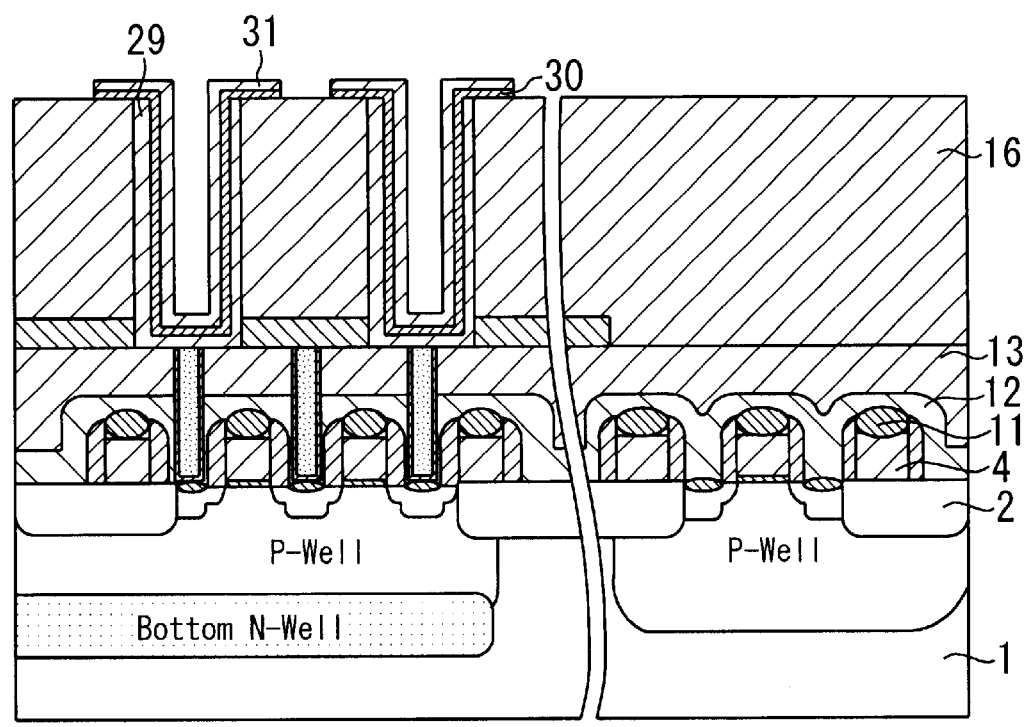

Furthermore, tantalum pentoxide (not shown), for example, is formed on the surface including the surfaces of the cylindrical capacitor openings 17 as shown in FIG. 32. Then, a film containing a high melting point metal such as ruthenium is formed and patterned by use of a photoresist. The tantalum pentoxide is used as a capacitor dielectric film 30, while the film containing a high melting point metal such as ruthenium is used as capacitor top electrodes 31.

Figure 33:
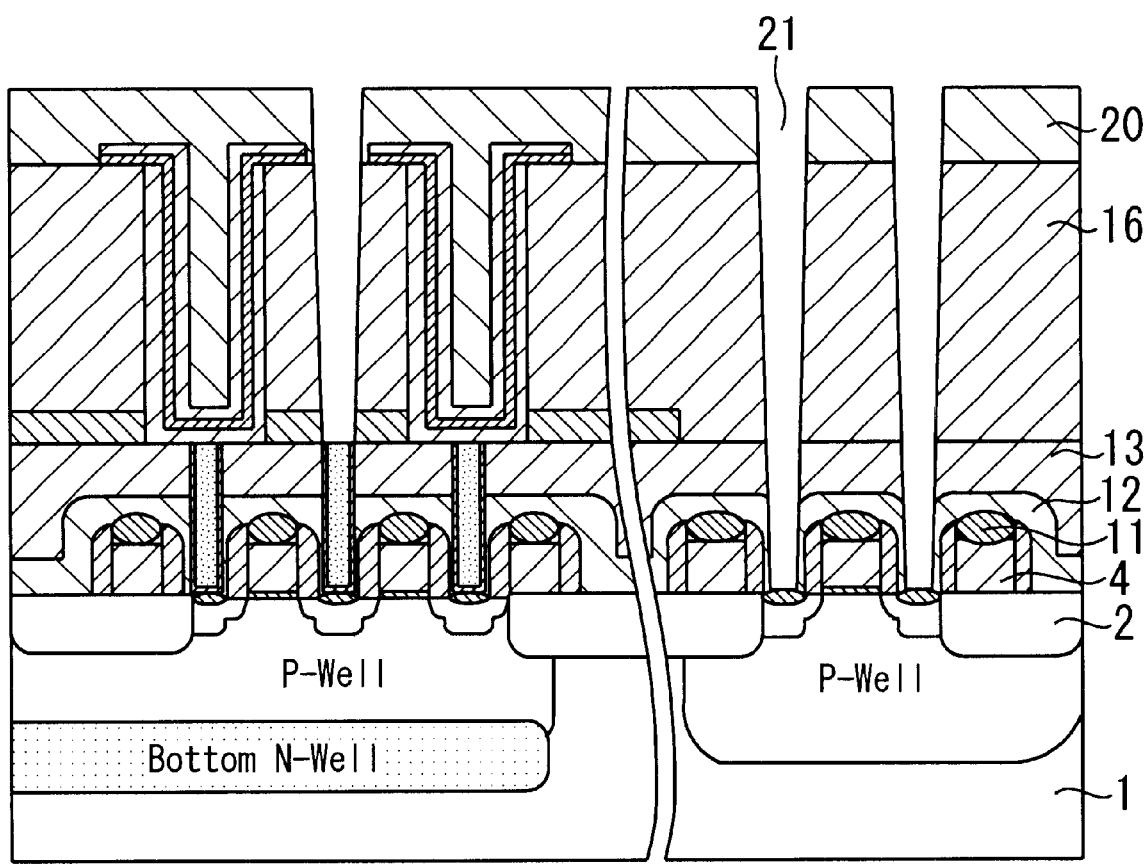

Then, as shown in FIG. 33, an interlayer insulation film 20 of plasma TEOS, etc. is formed on the capacitor top electrodes 31 and planarized by way of CMP (polishing). Subsequently, contact holes 21 are formed such that they reach the high melting point metal plugs 28 and the capacitor top electrodes (not shown) in the memory cell region and the source/drain regions 7a and 7b and the tops (not shown) of the gate electrodes in the logic circuit region.

The above formation process is set such that the first etching stops at a position inside the silicon nitride film 15 in the memory cell region and at a position inside the silicon nitride film 12 in the logic circuit region, and the second etching finally forms the openings in the silicon nitride films 12 and 15. Since the silicon nitride film 15 is disposed at a position higher than the position of the silicon nitride film 12, the silicon nitride film 15 is etched more than the silicon nitride film 12 is etched. Therefore, the film thickness of the silicon nitride film 15 is set to be thicker than the film thickness of the silicon nitride film 12.

Figure 34:
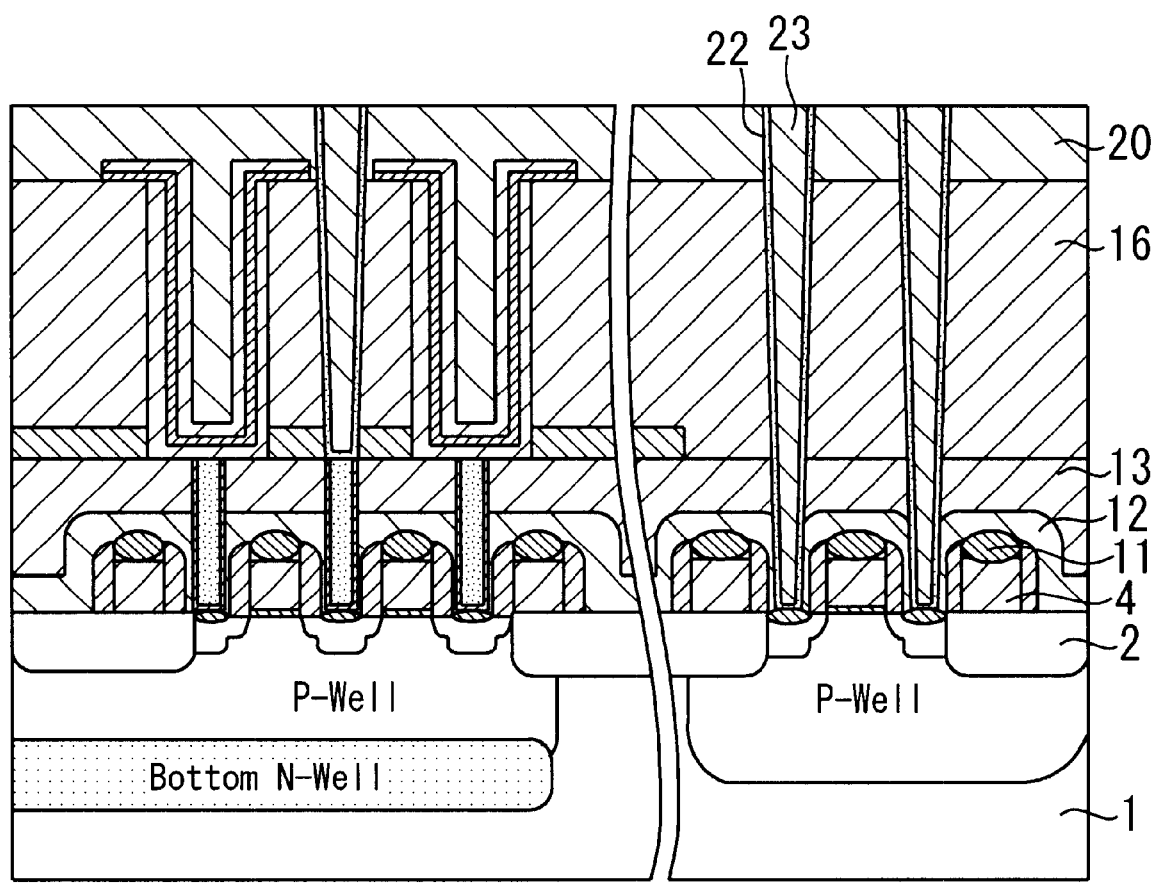

Then, as shown in FIG. 34, contact holes 21 are filled with titanium nitride 22 and a metal such as tungsten 23, acting as barrier metals, to form metal plugs.

Figure 35:
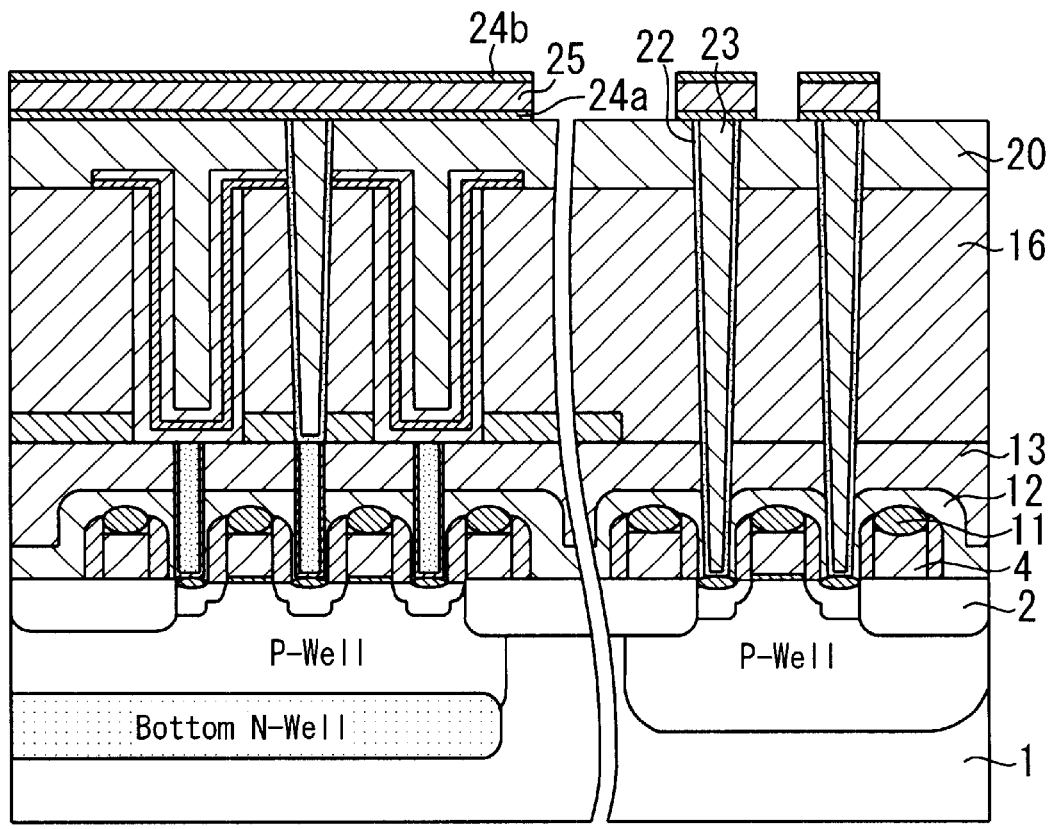

After that, as shown in FIG. 35, a film of aluminum sandwiched by films of titanium nitride 24a and 24b is formed and patterned to form bit lines in the memory cell region. Furthermore, aluminum wires are formed in the logic circuit region. The semiconductor device thus formed has a CUB (Capacitor Under Bit-line) structure in which the capacitor portions are disposed under bit lines 25.

The third embodiment produces the same effect as that of the first embodiment. Furthermore, since a low-resistance cobalt silicide film 11 is formed on the source/drain regions 6 and 7 and the gate electrodes 4 of all the transistors in the memory cell region in addition to the logic circuit region, the cobalt silicification reaction-resistant film USG need not be formed, making it possible to reduce the number of processes to be employed as well as reducing the resistance of the source/drain regions and the gate electrodes, resulting in high-speed operation and high integration (of semiconductor devices).

Further, since the contact holes for the source/drain regions in the memory cell region are filled with a barrier metal such as titanium nitride and high melting point metal plugs 28 of titanium, tungsten, etc., it is possible to reduce the resistance of the contacts.

Still further, since the capacitor bottom electrodes 29 are formed of a film containing a high melting point metal such as ruthenium, it is possible to reduce the influence of the reduction in the capacitance due to formation of depletion (regions), which raises a problem when forming the polycrystalline silicon electrodes.

Fourth Embodiment

Figure 36:
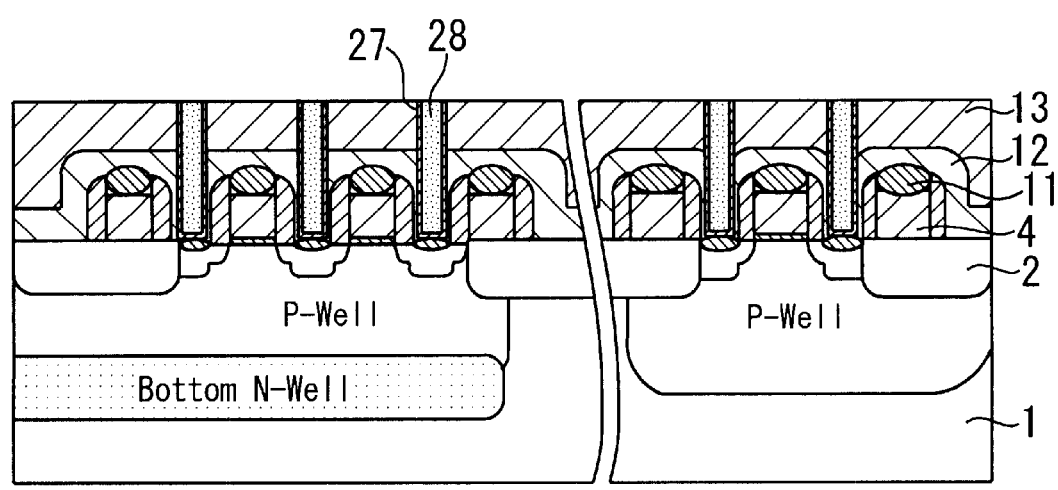
FIG. 36~FIG. 43 are each a structure of cross section showing a method for manufacturing a semiconductor device according to a fourth embodiment of the invention.

Description will be made below of a method for manufacturing a semiconductor device according to a fourth embodiment of the present invention with reference to FIGS. 36 to 43. The manufacturing method of the fourth embodiment performs the same processes as those shown in FIGS. 24 to 27 for the third embodiment before obtaining the structure shown in FIG. 36. Then, in the fourth embodiment, as shown in FIG. 36, contact holes are formed such that they reach the source/drain regions 6 and 7 and the gate electrodes (not shown) of the transistors in the memory cell region and the logic circuit region. The contact holes are then filled with barrier metals 27 of titanium nitride, etc. and high melting point metal plugs 28 of titanium or tungsten.

Figure 37:
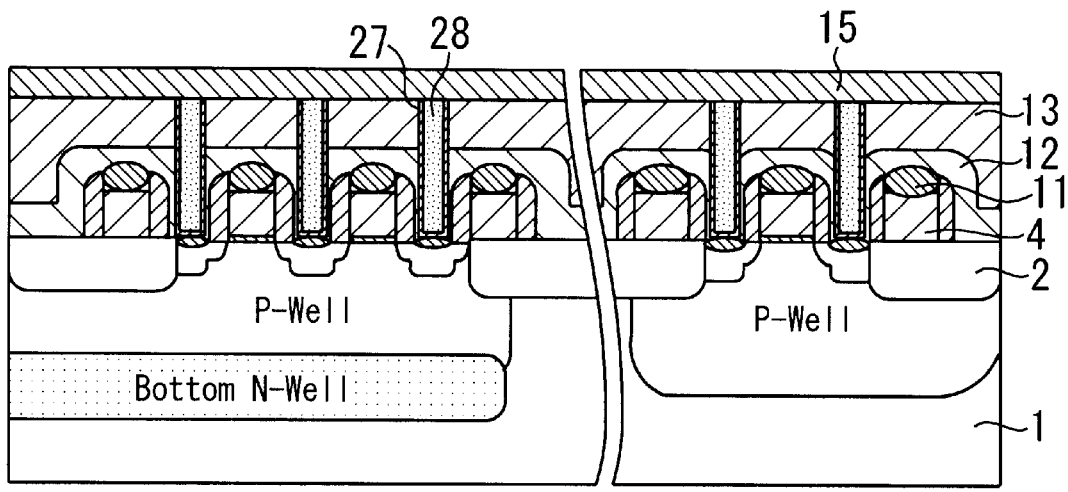

Then, as shown in FIG. 37, a silicon nitride film 15 is formed on the entire surface of the interlayer insulation film 13. The silicon nitride film 15 acts as an etching stopper film for contact holes formed in a subsequent process.

Figure 38:
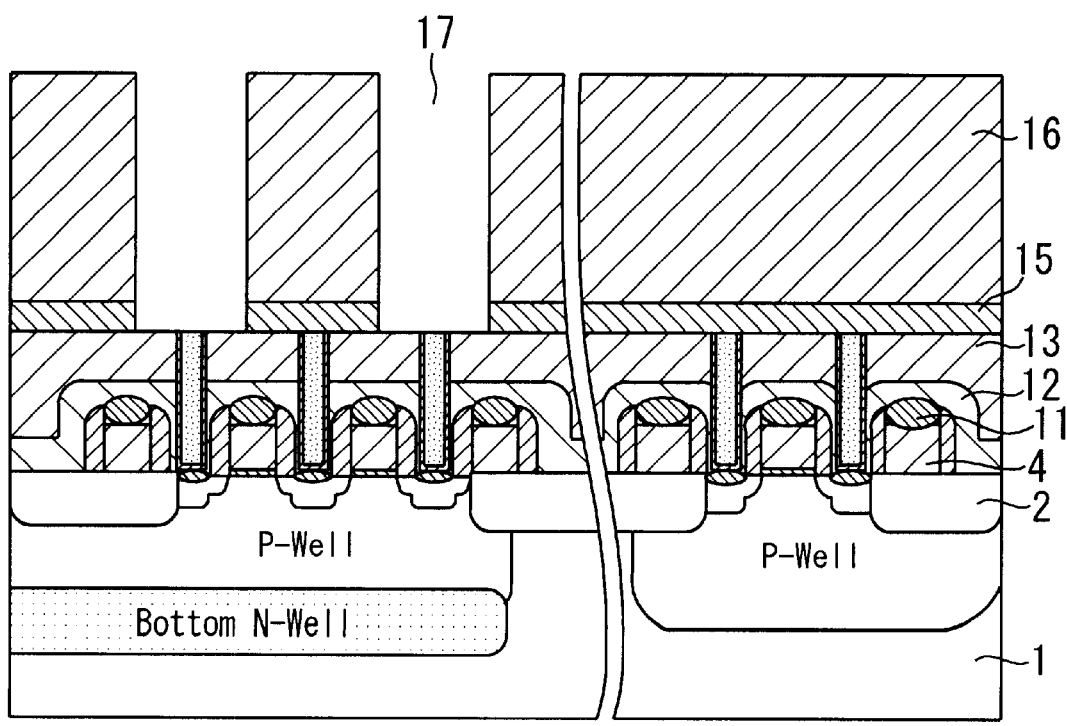
Figure 39:
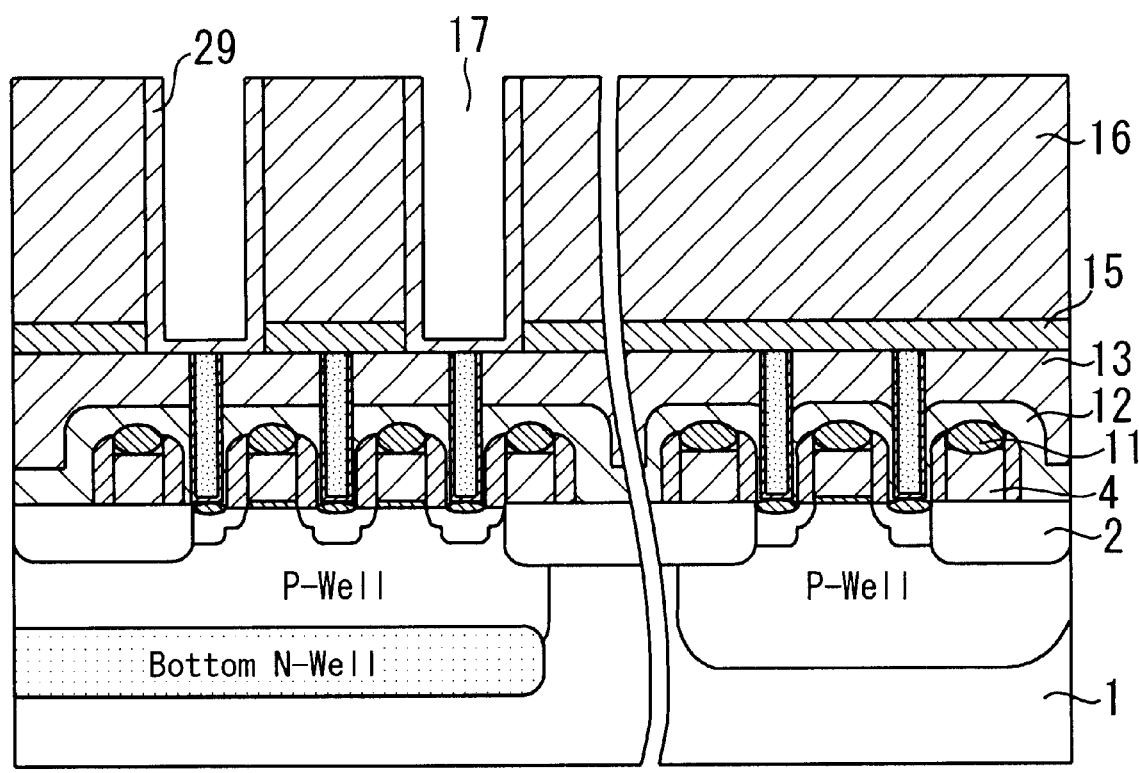

Furthermore, as shown in FIG. 38, an interlayer insulation film 16 of BPTEOS, etc. is laminated on the surface and planarized by way of CMP (polishing). The interlayer insulation film 16 is then etched using the silicon nitride film 15 as an etching stopper to form openings (which are portions of cylindrical capacitor openings 17 to be completed in the subsequent process). Subsequently, the silicon nitride film 15 is also etched so as to complete the formation of the cylindrical capacitor openings 17 reaching portions of the top surfaces of the high melting point metal plugs 28.

After that, a film containing a high melting point metal such as ruthenium is formed on the surface of the interlayer insulation film 16 including the surfaces of the cylindrical capacitor openings 17. The cylindrical capacitor openings 17 are then covered with a photoresist (not shown). In this state, the film containing a high melting point metal is subjected to anisotropic etching so as to leave the film (containing a high melting point metal such as ruthenium)

only inside the cylindrical capacitor openings 17. This completes the formation of capacitor bottom electrodes 29.

Figure 40:
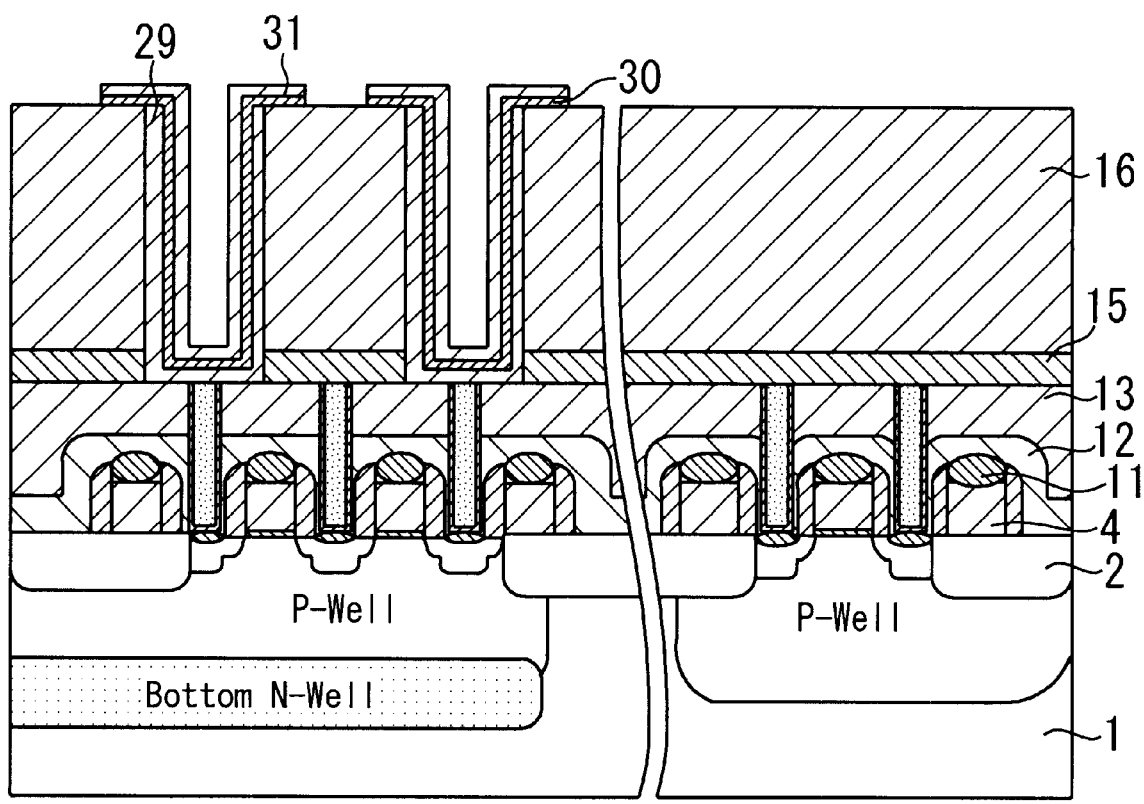

Furthermore, tantalum pentoxide is formed on the surface including the surfaces of the cylindrical capacitor openings 17 as shown in FIG. 40. Then, a film containing a high melting point metal such as ruthenium is formed and patterned by use of a photoresist. The tantalum pentoxide is used as a capacitor dielectric film 30, while the film containing a high melting point metal such as ruthenium is used as capacitor top electrodes 31.

Figure 41:
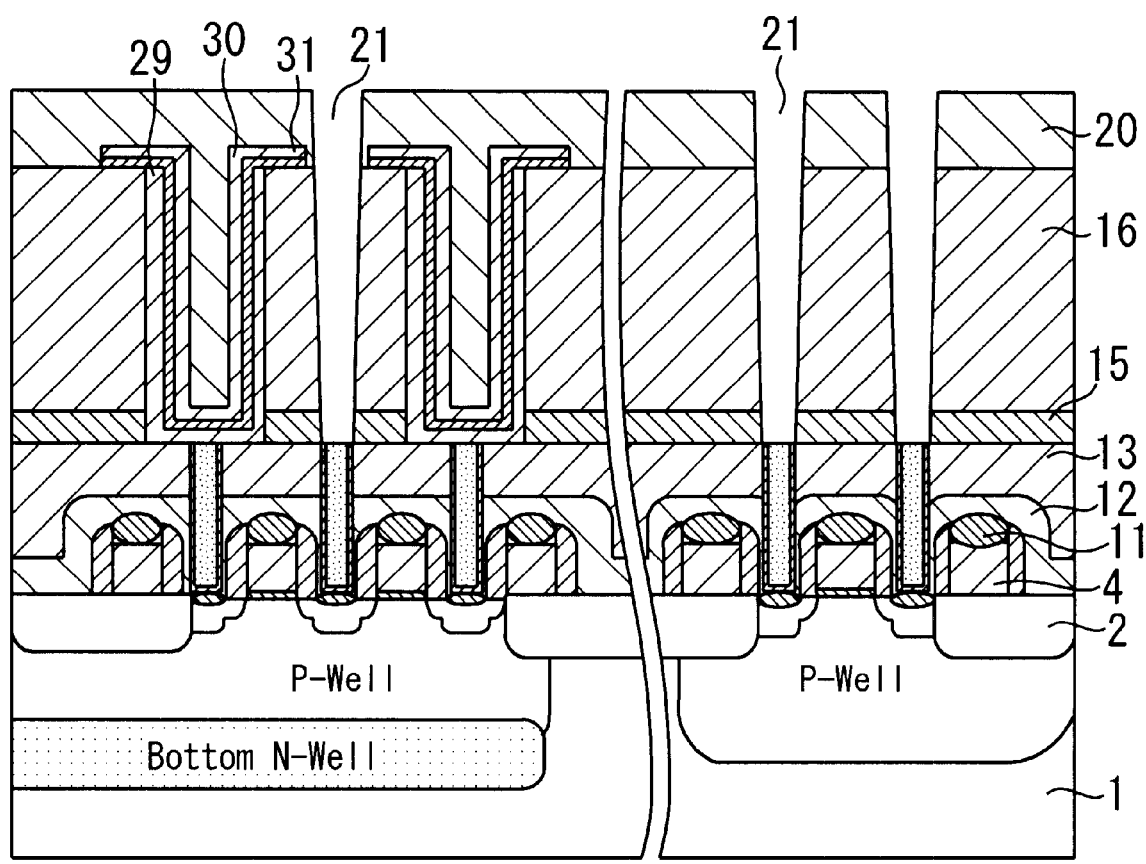

Then, as shown in FIG. 41, an interlayer insulation film 20 of plasma TEOS, etc. is formed on the capacitor top electrodes 31 and planarized by way of CMP (polishing). Subsequently, contact holes 21 are formed such that they reach the high melting point metal plugs 28 and the capacitor top electrodes (not shown) in the memory cell region and the source/drain regions 7a and 7b and the tops (not shown) of the gate electrodes in the logic circuit region.

The above formation process is set such that the first etching stops at a position inside the silicon nitride film 15 in the memory cell region, and the second etching finally forms the openings in the silicon nitride film 15.

Figure 42:
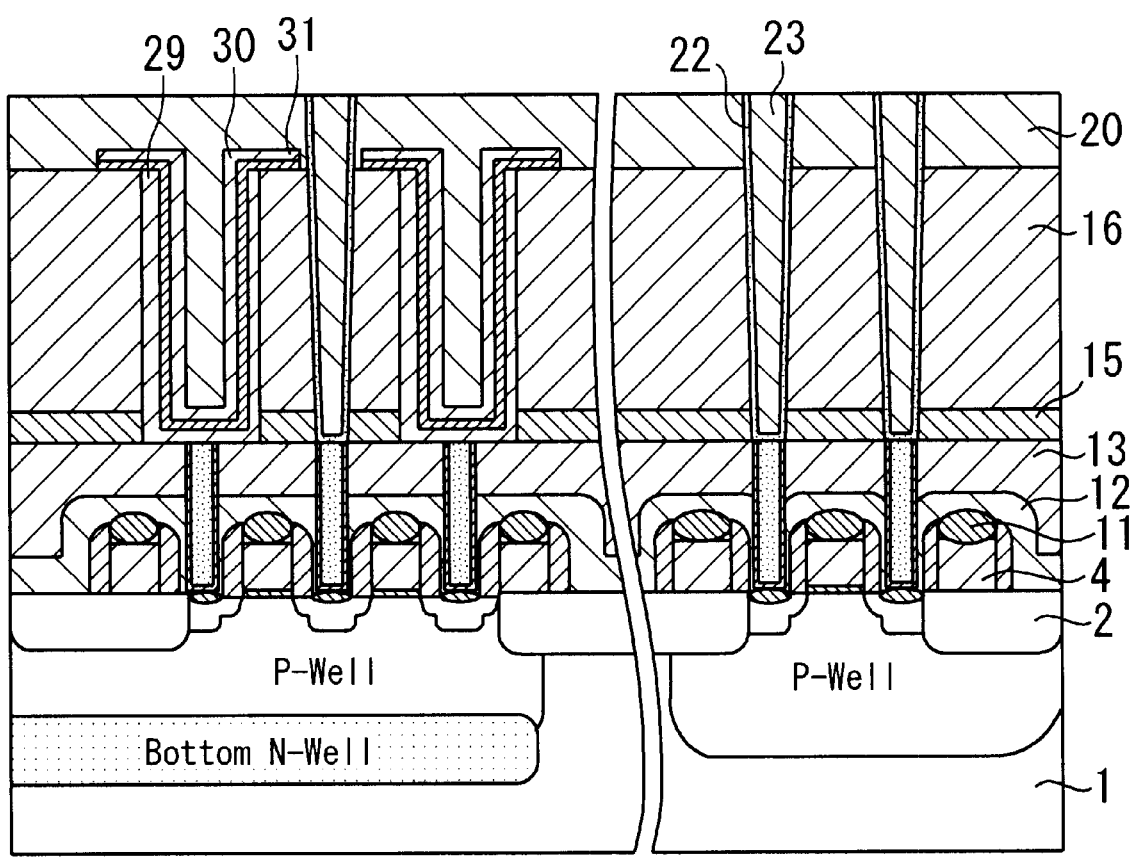

Then, as shown in FIG. 42, the contact holes 21 are filled with titanium nitride 22 and a metal such as tungsten 23, acting as barrier metals, to form metal plugs.

Figure 43:
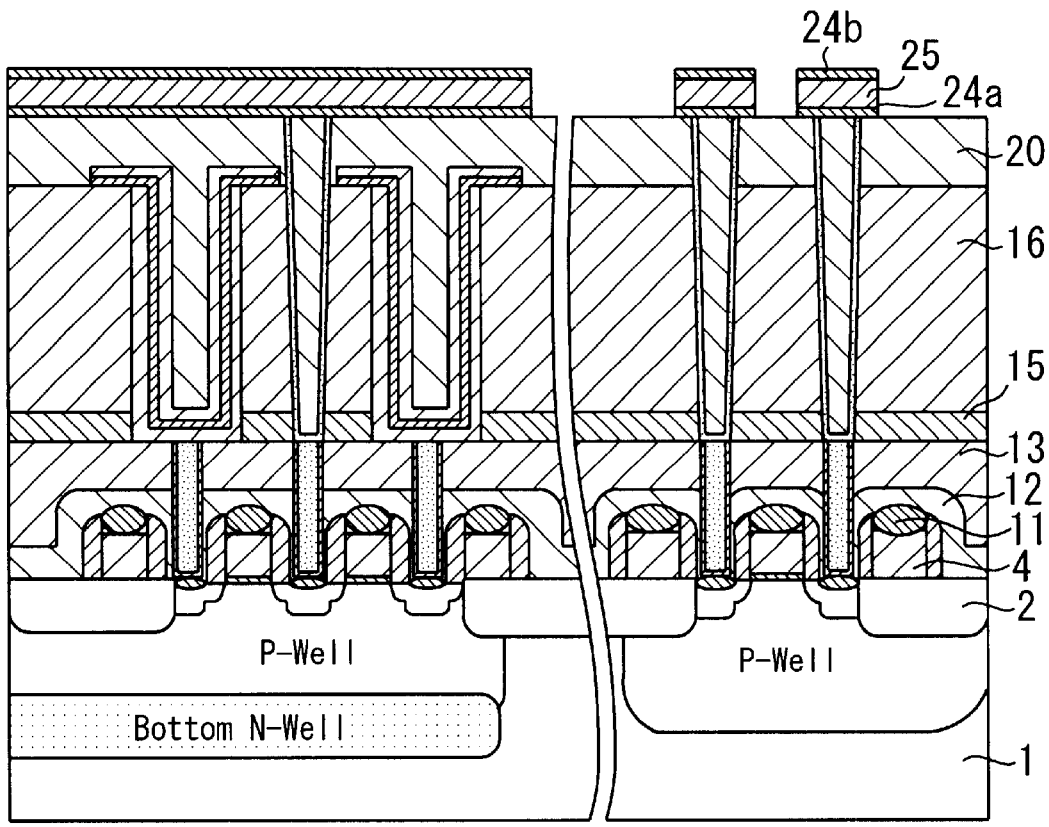
Figure 44:
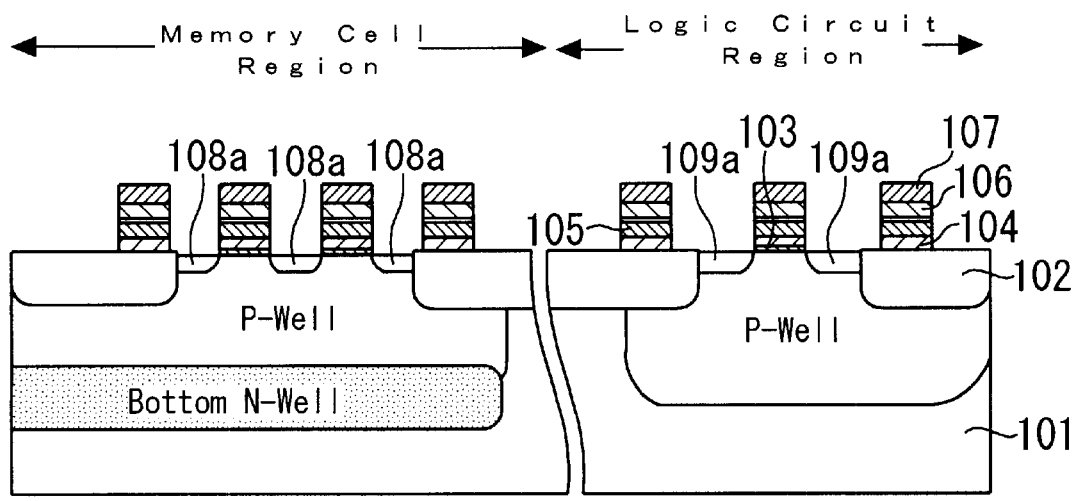
FIG. 44~FIG. 54 are each a structure of cross section showing a conventional method for manufacturing a semiconductor device.
Figure 45:
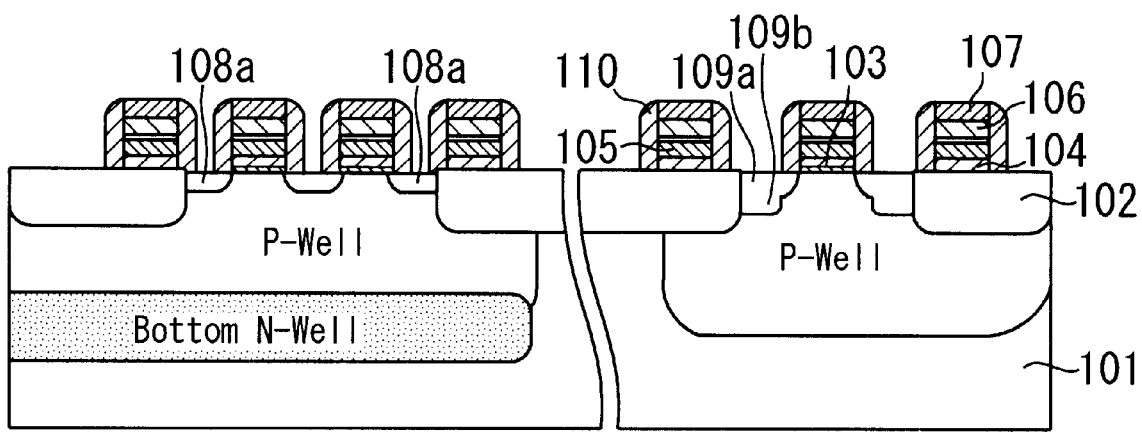
Figure 46:
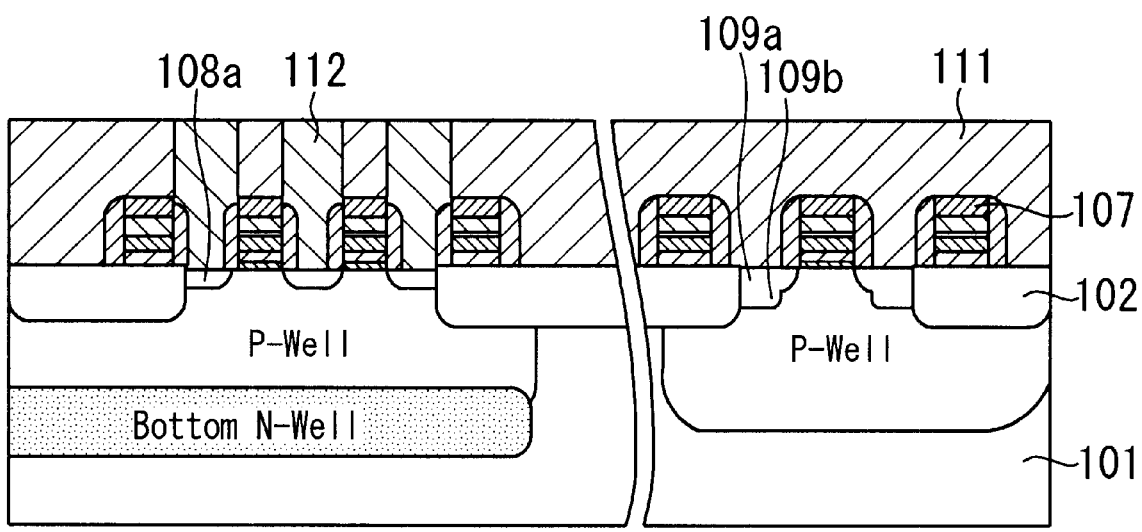
Figure 47:
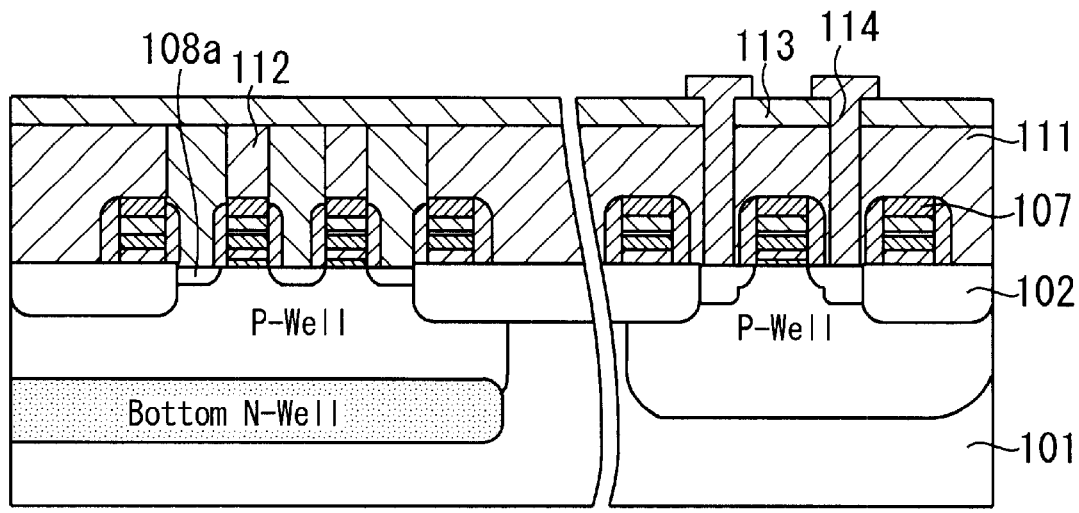
Figure 48:
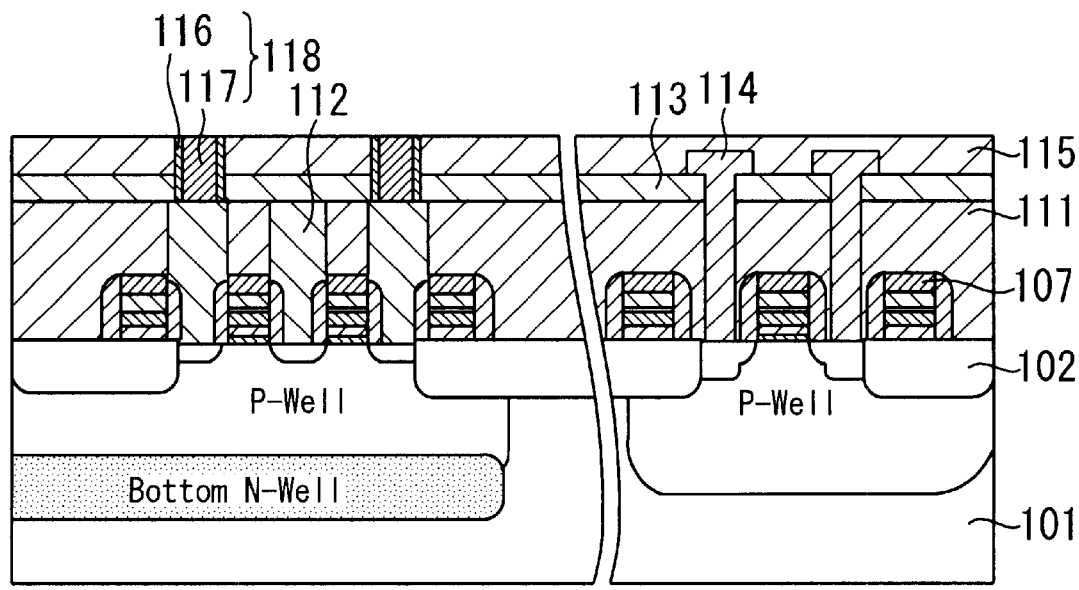
Figure 49:
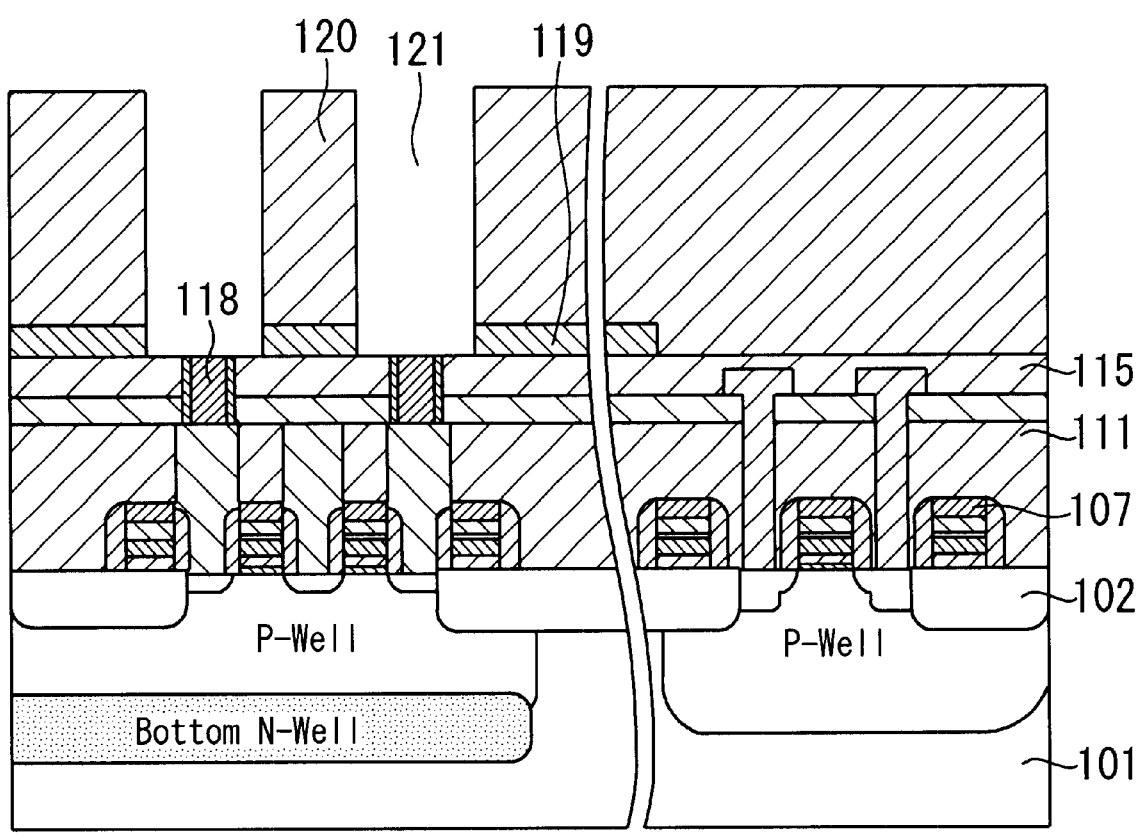
Figure 50:
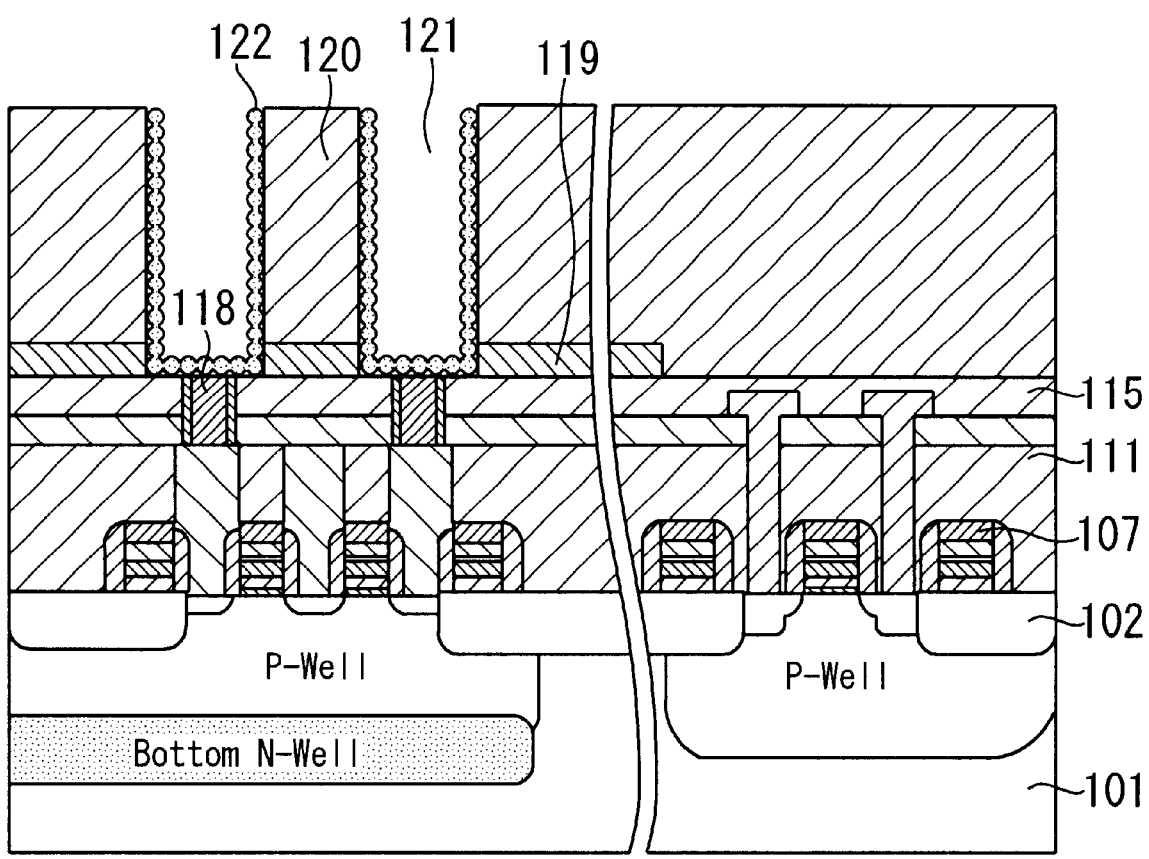
Figure 51:
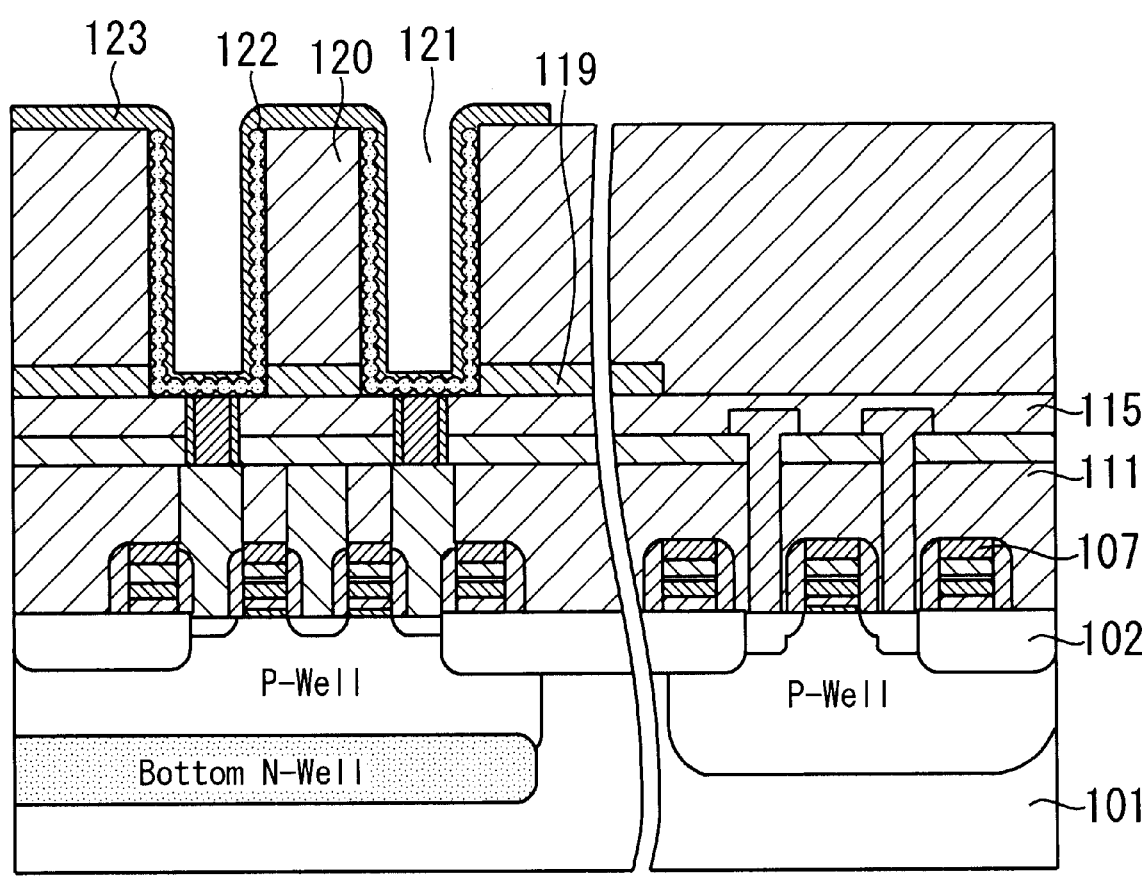
Figure 52:
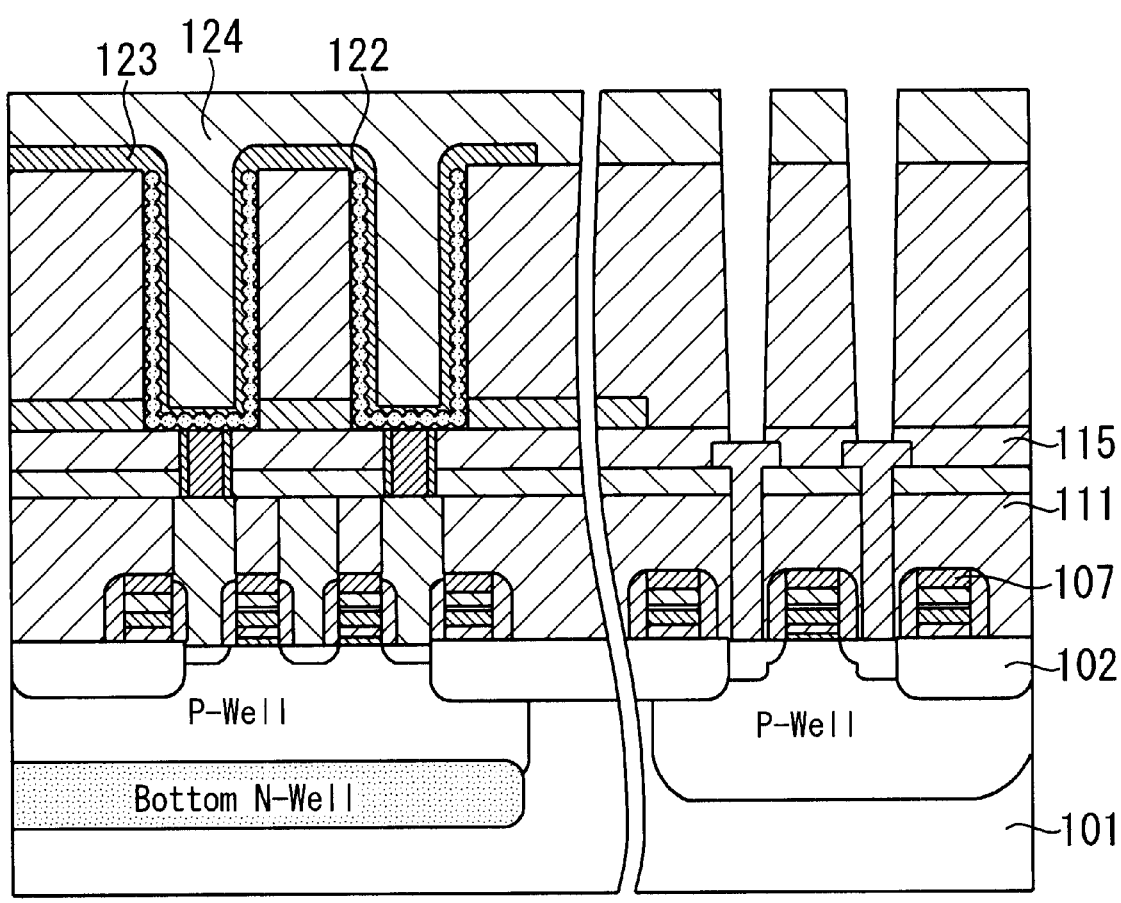
Figure 53:
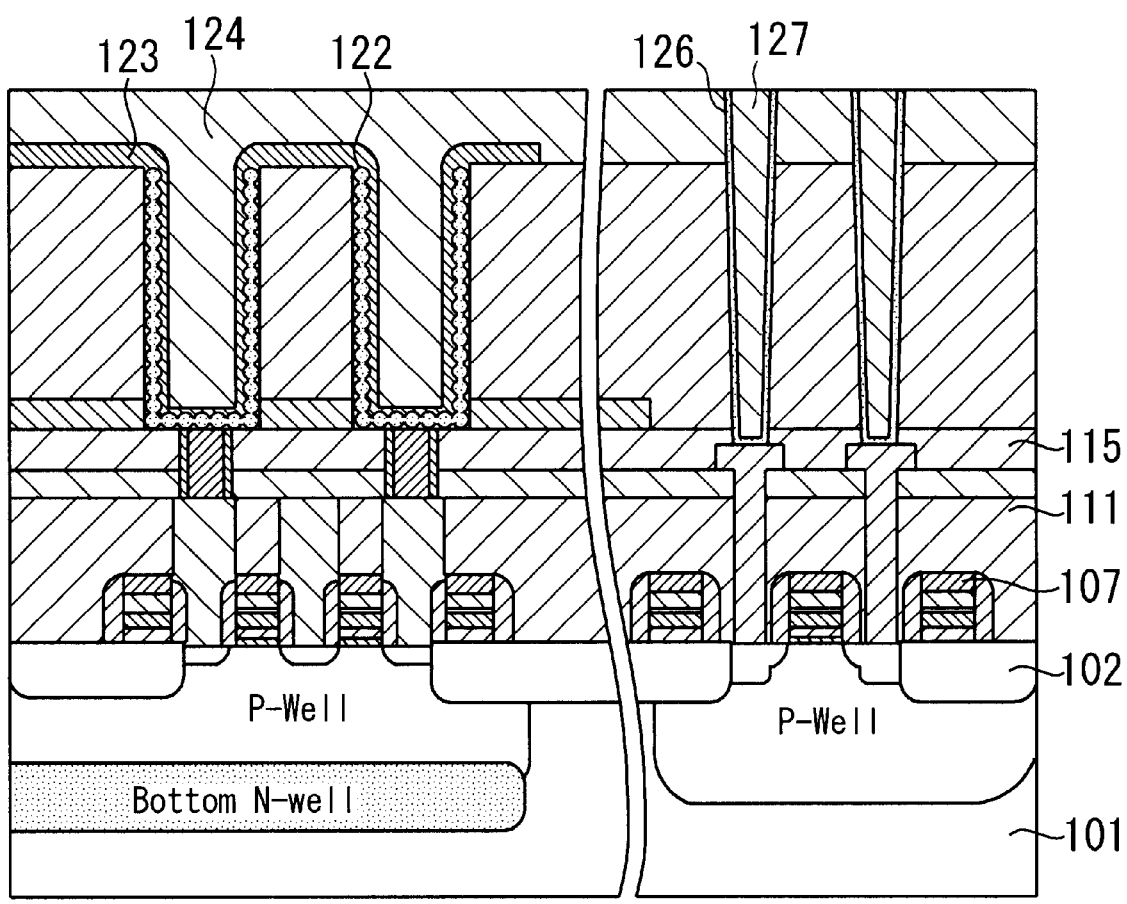
Figure 54:
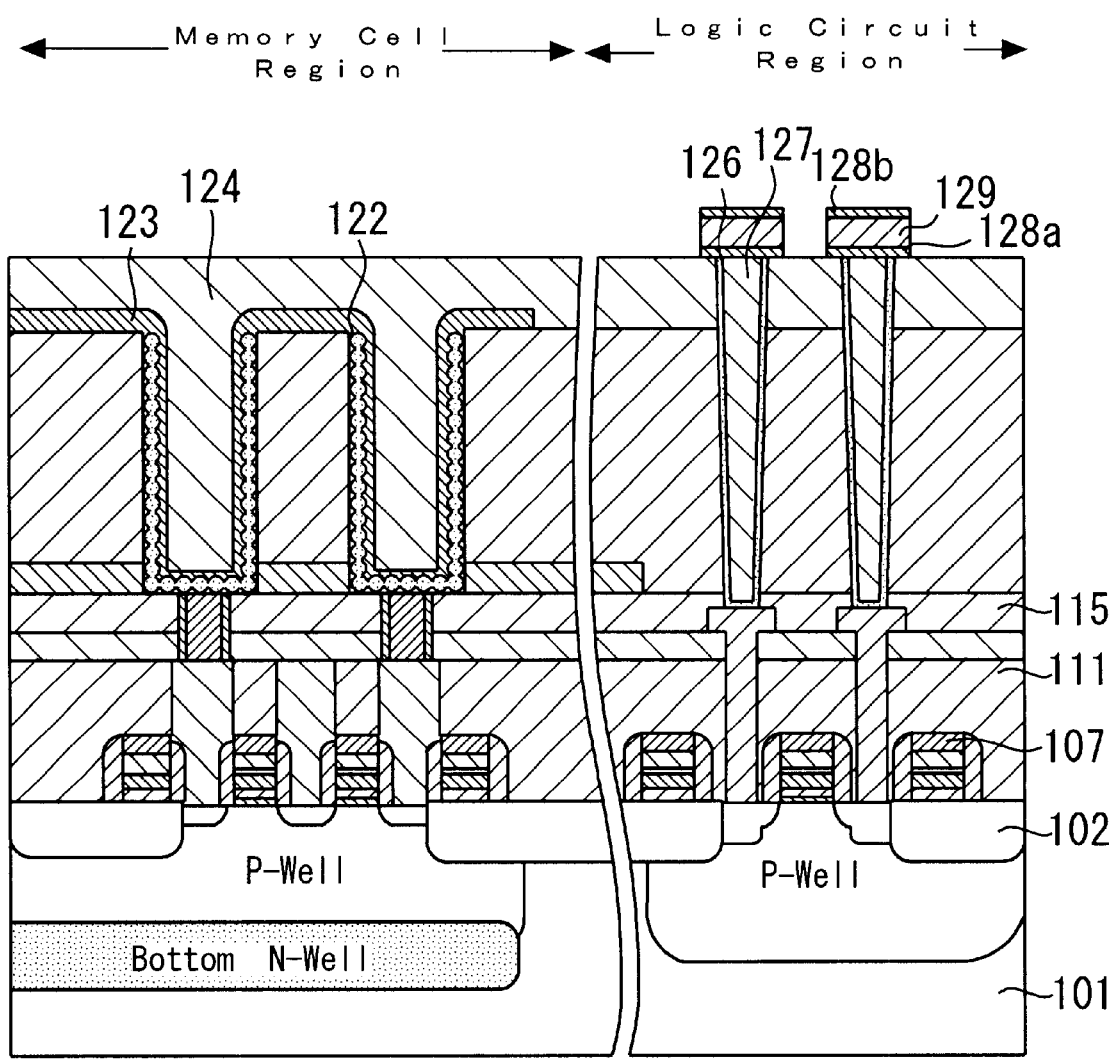

After that, as shown in FIG. 43, a film of aluminum sandwiched by films of titanium nitride 24a and 24b is formed and patterned to form bit lines in the memory cell region. Furthermore, aluminum wires are formed in the logic circuit region. The semiconductor device thus formed has a CUB (Capacitor Under Bit-line) structure in which the capacitor portions are disposed under bit lines 25.

The fourth embodiment produces the same effect as that of the third embodiment. In addition, forming the etching stopper nitride film 15 on the entire surface makes it possible to reduce the height difference between the memory cell region and the logic circuit region (through not shown). As a result, the photolithographic margin for the upper layers is reduced, which leads to increased yield.

Furthermore, both the bit line contacts in the memory cell region and the contacts in the logic circuit region have a 2-layer stack structure, making it possible to reduce the increase in the leak current due to etching damage to the semiconductor substrate 1.

The features and advantages of the present invention may be summarized as follows.

According to one aspect, methods for manufacturing a semiconductor device (having a memory cell region and a logic circuit region) form a cobalt silicide film on a third and fourth source/drain regions in the logic circuit region and a second gate electrode, making it possible to form a high-performance and highly integrated logic circuit.

Further, in the memory cell region, the bit lines are formed after the capacitor portions are formed. Therefore, the bit lines in the memory cell region can be formed on the same layer as that for the aluminum wires in the logic circuit region, making it possible to reduce the number of processes to be employed.

According to one aspect, a process of removing the cobalt silicification-resistant film from the memory cell region is further added after cobalt silicide is formed on the third and fourth source/drain regions in the logic circuit region and the second gate electrode. As a result, the height difference between the memory cell region and the logic circuit region is reduced, thereby reducing the photolithographic margin for the upper layers, which leads to increased yield.

Still further, since the cobalt silicification-resistant film in the memory cell region is removed, the reduction in the yield can be prevented.

According to one aspect, methods of the present invention for manufacturing a semiconductor device having a memory cell region and a logic circuit region form a low-resistance cobalt silicide film on all source/drain regions and gate electrodes in the memory cell region and the logic circuit region, eliminating the need for forming a cobalt silicification-resistant film, which makes it possible to reduce the number of processes to be employed. Furthermore, since the resistance of the source/drain regions and the gate electrodes is reduced, it is possible to realize high-speed operation and high integration (of semiconductor devices).

According to one aspect, by filling the openings to the first, second, and third source/drain regions on the semiconductor substrate with high melting point metal plugs, it is possible to reduce the contact resistance. Furthermore, forming a third silicon nitride film on the entire surface makes it possible to reduce the height difference between the memory cell region and the logic circuit region, reducing the photographic margin for the upper layers, which leads to increased yield.

Still further, since both the bit line contacts in the memory cell region and the contacts in the logic circuit region have a 2-layer stack structure made up of a high melting point metal plug and a metal plug, it is possible to reduce the increase in the leak current due to etching damage to the semiconductor substrate.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-090483, filed on Mar. 18, 2002 including specification, claims, drawings and summary, on which the Convention priority of the present application is based, are incorporated herein by reference in its entirety.

What is claimed is:

1. A method for manufacturing a semiconductor device having a memory cell region and a logic circuit region, said method comprising the steps of:

in said semiconductor substrate, forming a first gate electrode via a first gate oxide film on a first channel region and a second gate electrode via a second gate oxide film on a second channel region;

forming a pair of a first source/drain region and a second source/drain region in such a way that said first source/drain region and said second source/drain region are spaced from each other and sandwich said first channel region therebetween, and further forming a pair of a third source/drain region and a fourth source/drain region in such a way that said third source/drain region and said fourth source/drain region are spaced from each other and sandwich said second channel region therebetween;

forming a first silicon nitride film on an entire surface of said semiconductor substrate in such a way that said first silicon nitride film covers said first and second gate electrodes;

applying anisotropic etching to said first silicon nitride film to form sidewalls on sides of said first and second gate electrodes;

forming a cobalt silicification-resistant film on an entire surface of said semiconductor substrate in such a way that said cobalt silicification-resistant film covers said first and second gate electrodes, and removing said cobalt silicification-resistant film from said logic circuit region including a surface of said second gate electrode;

forming a cobalt silicide film on said third and fourth source/drain regions and said second gate electrode in said logic circuit region;

forming a second silicon nitride film on said semiconductor substrate;

forming a first interlayer insulation film on said second silicon nitride film;

etching portions of each of said first interlayer insulation film, said second silicon nitride film, and said cobalt silicification-resistant film over said first and second source/drain regions to form a first opening and a second opening which reach said first and second source/drain regions, respectively, and filling said first and second openings with polycrystalline silicon to form a first polycrystalline silicon plug and a second polycrystalline silicon plug;

forming a third silicon nitride film in said memory cell region on said first interlayer insulation film;

forming a second interlayer insulation film on said third silicon nitride film and said first interlayer insulation film;

etching said second interlayer insulation film and said third silicon nitride film to form a third opening which reaches said first polycrystalline silicon plug;

forming a capacitor portion in said third opening;

forming a third interlayer insulation film on said second interlayer insulation film in such a way that said third interlayer insulation film covers said capacitor portion;

etching said third silicon nitride film and said second and third interlayer insulation films to form a fourth opening which reaches said second polycrystalline silicon plug, and further etching said first, second, and third interlayer insulation films to form a fifth opening which reaches said third source/drain region;

filling said fourth and fifth openings with a barrier metal and a metal to form metal plugs; and forming a film of aluminum sandwiched by films of titanium nitride on said third interlayer insulation film, and patterning said film of aluminum to form bit lines and aluminum wires.

2. The method for manufacturing a semiconductor device according to claim 1, further comprising a step of:

removing said cobalt silicification-resistant film from said memory cell region after said step of forming cobalt silicide film on said third and fourth source/drain regions and said second gate electrode in said logic circuit region.

3. A method for manufacturing a semiconductor device having a memory cell region and a logic circuit region, said method comprising the steps of:

in said semiconductor substrate, forming a first gate electrode via a first gate oxide film on a first channel region and a second gate electrode via a second gate oxide film on a second channel region;

forming a pair of a first source/drain region and a second source/drain region in such a way that said first source/drain region and said second source/drain region are spaced from each other and sandwich said first channel region therebetween, and further forming a pair of a third source/drain region and a fourth source/drain region in such a way that said third source/drain region and said fourth source/drain region are spaced from each other and sandwich said second channel region therebetween;

forming a first silicon nitride film on an entire surface of said semiconductor substrate in such a way that said first silicon nitride film covers said first and second gate electrodes;

applying anisotropic etching to said first silicon nitride film to form sidewalls on sides of said first and second gate electrodes;

forming a cobalt silicide film on said first and second source/drain regions and said first gate electrode in said memory cell region, and on said third and fourth source/drain regions and said second gate electrode in said logic circuit region;

forming a second silicon nitride film on said semiconductor substrate;

forming a first interlayer insulation film on said second silicon nitride film;

etching portions of each of said first interlayer insulation film and said second silicon nitride film over said first and second source/drain regions to form a first opening and a second opening which reach said first and second source/drain regions, respectively, and filling said first and second openings with a high melting point metal film to form a first high melting point metal plug and a second high melting point metal plug;

forming a third silicon nitride film in said memory cell region on said first interlayer insulation film;

forming a second interlayer insulation film on said third silicon nitride film and said first interlayer insulation film;

etching said second interlayer insulation film and said third silicon nitride film to form a third opening which reaches said first high melting point metal plug;

forming a capacitor portion in said third opening;

forming a third interlayer insulation film on said second interlayer insulation film in such a way that said third interlayer insulation film covers said capacitor portion;

etching said third silicon nitride film and said second and third interlayer insulation films to form a fourth opening which reaches said second high melting point metal plug, and further etching said first, second, and third interlayer insulation films to form a fifth opening which reaches said third source/drain region;

filling said fourth and fifth openings with a barrier metal and a metal to form metal plugs; and forming a film of aluminum sandwiched by films of titanium nitride on said third interlayer insulation film, and patterning said film of aluminum to form bit lines and aluminum wires.

4. A method for manufacturing a semiconductor device having a memory cell region and a logic circuit region, said method comprising the steps of:

in said semiconductor substrate, forming a first gate electrode via a first gate oxide film on a first channel region and a second gate electrode via a second gate oxide film on a second channel region;

forming a pair of a first source/drain region and a second source/drain region in such a way that said first source/drain region and said second source/drain region are spaced from each other and sandwich said first channel region therebetween, and further forming a pair of a third source/drain region and a fourth source/drain region in such a way that said third source/drain region and said fourth source/drain region are spaced from each other and sandwich said second channel region therebetween;

forming a first silicon nitride film on an entire surface of said semiconductor substrate in such a way that said first silicon nitride film covers said first and second gate electrodes;

applying anisotropic etching to said first silicon nitride film to form sidewalls on sides of said first and second gate electrodes;

forming a cobalt silicide film on said first and second source/drain regions and said first gate electrode in said memory cell region, and on said third and fourth source/drain regions and said second gate electrode in said logic circuit region;

forming a second silicon nitride film on said semiconductor substrate;

forming a first interlayer insulation film on said second silicon nitride film;

etching portions of each of said first interlayer insulation film and said second silicon nitride film over said first, second, and third source/drain regions to form a first opening, a second opening, and a third opening which reach said first, second, and third source/drain regions, respectively, and filling said first, second, and third openings with a high melting point metal film to form a first high melting point metal plug, a second high melting point metal plug, and a third high melting point metal plug;

forming a third silicon nitride film on an entire surface of said first interlayer insulation film;

forming a second interlayer insulation film on said third silicon nitride film;

etching said second interlayer insulation film and said third silicon nitride film to form a fourth opening which reaches said first high melting point metal plug;

forming a capacitor portion in said fourth opening;

forming a third interlayer insulation film on said second interlayer insulation film in such a way that said third interlayer insulation film covers said capacitor portion;

etching said third silicon nitride film and said second and third interlayer insulation films to form a fifth opening and a sixth opening which reach said second and third high melting point metal plugs, respectively;

filling said fifth and sixth openings with a barrier metal and a metal to form metal plugs; and forming a film of aluminum sandwiched by films of titanium nitride on said third interlayer insulation film, and patterning said film of aluminum to form bit lines and aluminum wires.

* * * * *